(12) United States Patent
Hara et al.

(10) Patent No.: US 12,363,462 B2
(45) Date of Patent: Jul. 15, 2025

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventors: Takuya Hara, Kanagawa (JP); Masanori Ogura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/510,471

(22) Filed: Nov. 15, 2023

(65) Prior Publication Data

US 2024/0171880 A1 May 23, 2024

(30) Foreign Application Priority Data

Nov. 18, 2022 (JP) .................................. 2022-185024

(51) Int. Cl.
*H04N 25/773* (2023.01)
*B60R 16/023* (2006.01)
*H04N 25/79* (2023.01)
*H10F 39/18* (2025.01)

(52) U.S. Cl.
CPC ........... *H04N 25/773* (2023.01); *H04N 25/79* (2023.01); *B60R 16/0231* (2013.01); *H10F 39/182* (2025.01)

(58) Field of Classification Search
CPC .... H04N 25/773; H04N 25/79; H04N 25/671; B60R 16/0231; H01L 27/14645; H01L 27/146; H10F 39/182; H10F 39/12
See application file for complete search history.

(56) References Cited

U.S. PATENT DOCUMENTS

| | | | |
|---|---|---|---|
| 2014/0211058 A1* | 7/2014 | Nishihara | H04N 25/65 348/308 |
| 2021/0291821 A1* | 9/2021 | Dakemoto | B60W 50/00 |
| 2024/0314470 A1* | 9/2024 | Higuchi | G01J 1/44 |
| 2024/0323565 A1* | 9/2024 | Takatsuka | H04N 25/768 |

FOREIGN PATENT DOCUMENTS

JP    2020155886 A    9/2020

\* cited by examiner

*Primary Examiner* — Michael E Teitelbaum
(74) *Attorney, Agent, or Firm* — Canon U.S.A., Inc. IP Division

(57) ABSTRACT

A photoelectric conversion apparatus includes a first pixel, a second pixel, and an offset adding circuit. The first pixel includes a first avalanche photodiode and a first count circuit. The first count circuit is configured to count a first signal that is based on the number of photons that have entered the first avalanche photodiode. The second pixel includes a second avalanche photodiode and a second count circuit. The second count circuit is configured to count a second signal that is based on the number of photons that have entered the second avalanche photodiode. The offset adding circuit is configured to set an offset value for each of the first count circuit and the second count circuit. The first count circuit starts a first counter operation from a first offset value. The second count circuit starts a second counter operation from a second offset value.

17 Claims, 19 Drawing Sheets

PHOTOELECTRIC CONVERSION APPARATUS, PHOTOELECTRIC CONVERSION SYSTEM, AND MOVING BODY

BACKGROUND

Technical Field

The present disclosure relates to a photoelectric conversion apparatus that uses an avalanche photodiode, and a control method of the photoelectric conversion apparatus.

Description of the Related Art

In recent years, a photon-counting image sensor has attracted attention as an image sensor used in a digital camera. This image sensor is called a single photon avalanche diode (SPAD). Utilizing an avalanche phenomenon that occurs when an avalanche photodiode is operated in a Geiger mode, the image sensor improves image quality under dark environment by counting the number of incident photons and outputting the counted number as a digital signal.

Japanese Patent Application Laid-Open No. 2020-155886 discusses a photoelectric conversion apparatus in which a plurality of digital counters (hereinafter, will be described as counters) respectively connected to a plurality of pixels counts the number of photons in accordance with an incident light amount. When light with a uniform light amount enters the photoelectric conversion apparatus, output potential levels of the plurality of counters connected to the plurality of pixels simultaneously switch, and a source voltage varies. This might cause image degradation such as unevenness and spots.

SUMMARY

The present disclosure is directed to improving image quality by suppressing a variation in source voltage connected to a counter.

According to an aspect of the disclosure, a photoelectric conversion apparatus includes a first pixel, a second pixel, and an offset adding circuit. The first pixel includes a first avalanche photodiode and a first count circuit. The first count circuit is configured to count a first signal that is based on the number of photons that have entered the first avalanche photodiode. The second pixel includes a second avalanche photodiode and a second count circuit. The second count circuit is configured to count a second signal that is based on the number of photons that have entered the second avalanche photodiode. The offset adding circuit is configured to set an offset value for each of the first count circuit and the second count circuit. The first count circuit starts a first counter operation from a first offset value. The second count circuit starts a second counter operation from a second offset value.

Further features of the disclosure will become apparent from the following description of exemplary embodiments with reference to the attached drawings.

DESCRIPTION OF THE EMBODIMENTS

Figure 1:
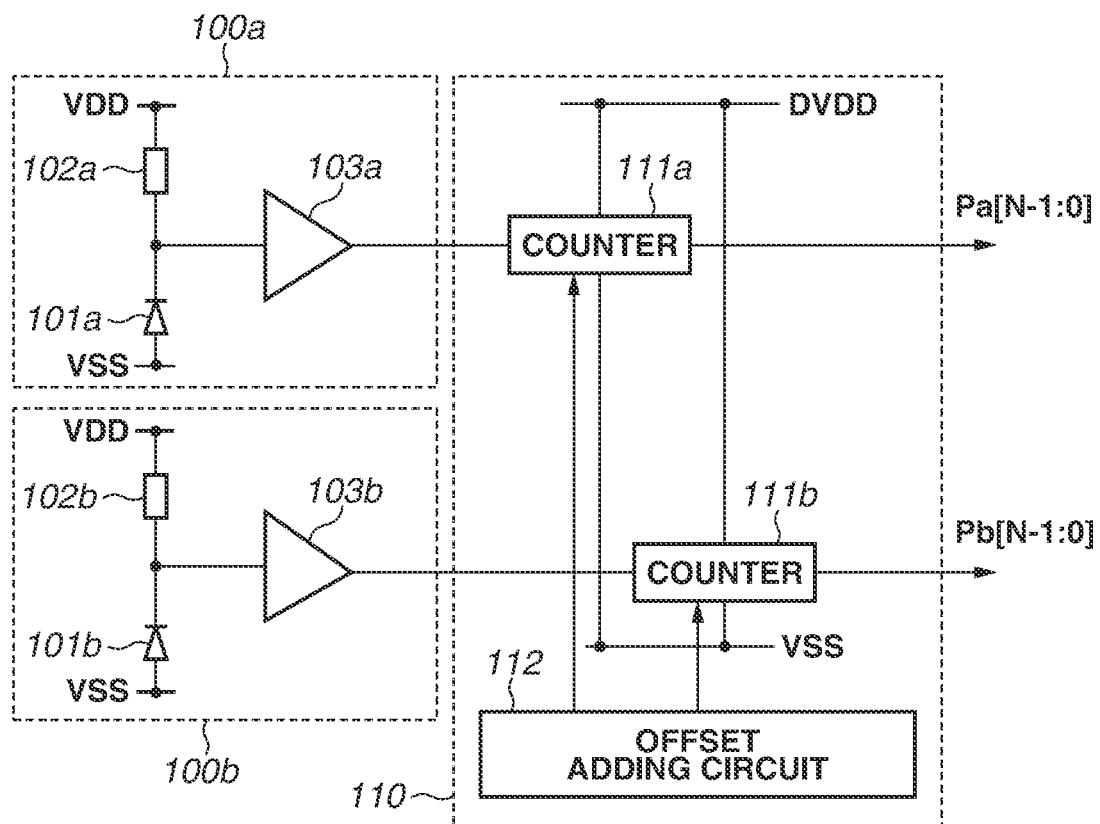
FIG. 1 is a block diagram illustrating a pixel configuration of a photoelectric conversion apparatus to be applied to a first exemplary embodiment.

The following exemplary embodiments are provided to embody the technical idea of the present disclosure, and are not intended to limit the present disclosure. The sizes and the positional relationship of members illustrated in the drawings are sometimes exaggerated to clarify the description. In the following description, the same components are assigned the same reference numerals, and the description thereof will be sometimes omitted.

Hereinafter, exemplary embodiments of the present disclosure will be described in detail with reference to the drawings. In the following description, terms (e.g., "up", "down", "right", "left", and other terms including these terms) indicating specific directions and positions are used as necessary. These terms are used to facilitate the understanding of an exemplary embodiment to be described with reference to the drawings. The technical scope of the present disclosure is not to be limited by the meanings of these terms.

In this specification, a planar view refers to a view from a direction vertical to a light incidence surface of a semiconductor layer. In addition, a cross section refers to a surface in the direction vertical to the light incidence surface of the semiconductor layer. In a case where the light incidence surface of the semiconductor layer is a rough surface when viewed microscopically, a planar view is defined based on a light incidence surface of a semiconductor layer that is viewed macroscopically.

In the following description, an anode of an avalanche photodiode (APD) is set to a fixed potential, and a signal is taken out from a cathode side. Thus, a semiconductor region of a first conductivity type in which a charge of the same polarity as a signal charge is regarded as a majority carrier is an N-type semiconductor region, and a semiconductor region of a second conductivity type in which a charge of a polarity different from that of a signal charge is regarded as a majority carrier is a P-type semiconductor region.

Even in a case where a cathode of an APD is set to a fixed potential, and a signal is taken out from an anode side, the present disclosure can be realized. In this case, the semiconductor region of the first conductivity type in which a charge of the same polarity as a signal charge is regarded as a majority carrier is the P-type semiconductor region, and the semiconductor region of the second conductivity type in which a charge of a polarity different from that of a signal charge is regarded as a majority carrier is the N-type semiconductor region. The following description will be given of a case where one node of an APD is set to a fixed potential, but potentials at both nodes may be made variable.

In this specification, in a case where the term "impurity concentration" is simply used, the term means a net impurity concentration obtained by subtracting an amount compensated by an impurity of an opposite conductivity type. In short, the "impurity concentration" refers to a NET doping concentration. A region in which a P-type additive impurity concentration is higher than an N-type additive impurity concentration is the P-type semiconductor region. In contrast, a region in which an N-type additive impurity concentration is higher than a P-type additive impurity concentration is the N-type semiconductor region.

A photoelectric conversion element according to a first exemplary embodiment will be described.

FIG. 1 is a block diagram illustrating an example of a configuration of a photoelectric conversion element according to the first exemplary embodiment.

Each photoelectric conversion element includes a plurality of pixel units 100 and a signal processing circuit or unit 110. The pixel unit or circuit 100 (100a, 100b) includes an avalanche photodiode (APD) 101 (APD 101a, APD 101b) serving as a light receiving element, a quench resistor 102 (102a, 102b), and a pulse conversion unit 103 (103a, 103b). Furthermore, the signal processing circuit 110 includes counters 111 (111a and 111b) each connected to the pixel units 100, and an offset adding circuit 112.

Next, electric connection in each photoelectric conversion element will be described using an example of the pixel unit 100a in FIG. 1. An anode end of the APD 101a (first avalanche photodiode) included in the pixel unit 100a is connected to a source voltage VSS, and a cathode end thereof is connected to the quench resistor 102a and the pulse conversion unit 103a. The other terminal of the quench resistor 102a is connected to a source voltage VDD. A signal output from the APD 101a is input to the pulse conversion unit 103a, and an output end of the pulse conversion unit 103a is connected to the counter 111a. The counter 111a is connected to a source voltage DVDD and the source voltage VSS, and outputs an N-bit digital signal output Pa based on a signal input from the pulse conversion unit 103a, and a signal input from the offset adding circuit 112.

The pixel unit 100b including the APD 101b (second avalanche photodiode) is connected as in the pixel unit 100a, and the pixel unit 100b outputs an N-bit digital signal output Pb.

A circuit operation of the pixel unit 100 is not limited to a circuit operation to be described with reference to FIGS. 13A, 13B, and 14, and the pixel unit 100 may be controlled by a so-called passive quench operation.

In a case where the pixel unit 100 is controlled by a passive quench operation, first of all, an inversely-biased voltage at a level equal to or larger than a breakdown voltage is applied to the APD 101a via the quench resistor 102a from a power supply line supplying the source voltage VDD. The APD 101a is accordingly set to operate in a Geiger mode.

If a photon enters the APD 101a, an avalanche phenomenon occurs based on an electron excited by the incident photon, and a current attributed to avalanche multiplication is generated. Furthermore, by the current flowing to the quench resistor 102a, a voltage drop occurs in the quench resistor 102a, and a cathode potential of the APD 101a drops. If the cathode potential of the APD 101a drops up to a certain fixed voltage value, the APD 101a enters a non-Geiger mode, and the avalanche multiplication stops. By the avalanche multiplication stopping, the cathode potential is raised by the quench resistor 102a up to the source voltage VDD, and an operation in the Geiger mode becomes executable again.

The pulse conversion unit 103a converts a potential change at a node to which a cathode of the APD 101a and the quench resistor 102a are connected, into a pulse signal transitioning in state in accordance with a predetermined threshold value.

That is, it is possible to generate a voltage pulse having a pulse width corresponding to a time during which a photon enters and a current attributed to avalanche multiplication is generated. Thus, a voltage pulse corresponding to photon incidence is output from an output terminal of the pulse conversion unit 103.

The counter 111a counts a voltage pulse output from the pulse conversion unit 103a.

At this time, the counter 111a starts counting using a signal input by the offset adding circuit 112, as an offset (default value). The reason why the offset is set for the counter will be described below.

Figure 2:
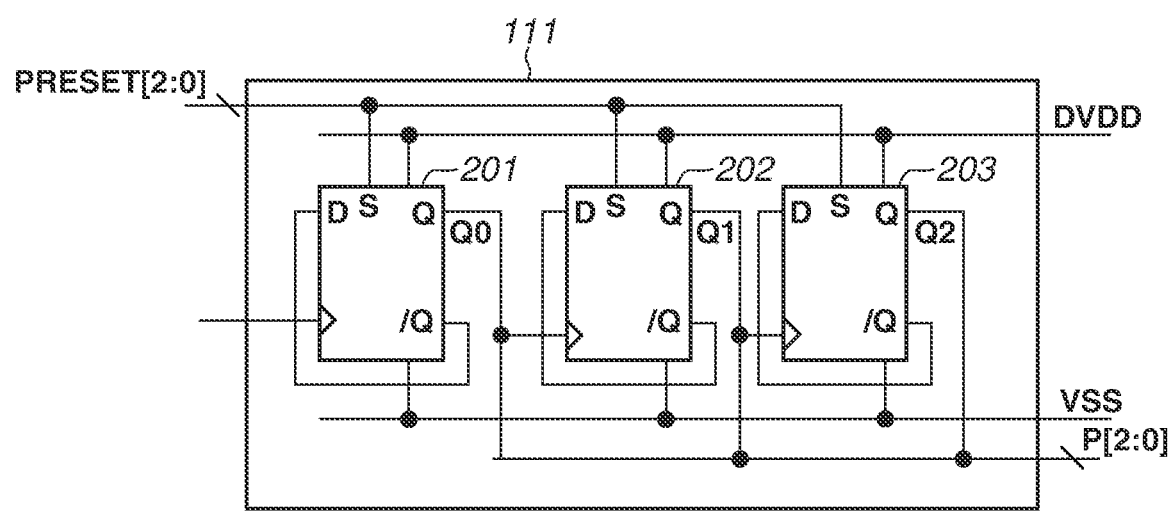
FIG. 2 is a diagram illustrating a configuration of a signal processing circuit unit to be applied to the first exemplary embodiment.

An example of a configuration of the counter 111 will be described with reference to FIG. 2. FIG. 2 illustrates an example of a 3-bit binary counter as an example of the counter 111, but the number of bits and a counter type are not limited to this.

The counter 111 includes, for example, a D flip-flop circuit 201, a D flip-flop circuit 202, and D flip-flop circuit 203. The D flip-flop circuit 201, the D flip-flop circuit 202, and the D flip-flop circuit 203 each include a signal input terminal, an input terminal (D), an output terminal (Q), an inverted output terminal (/Q), and a preset terminal (S), and are connected to the source voltages DVDD and VSS.

Next, electric connection in each element will be described.

The D flip-flop circuit 201, the D flip-flop circuit 202, and the D flip-flop circuit 203 are cascade-connected. Specifically, in the D flip-flop circuit 201, the input terminal (D) and the inverted output terminal (/Q) are electrically connected to each other, and the output terminal (Q0) is connected to the signal input terminal of the subsequent D flip-flop circuit 202. The output terminal (Q0) of the D flip-flop circuit 201 outputs a first-bit signal. In the D flip-flop circuit 202, the input terminal (D) and the inverted output terminal (/Q) are electrically connected to each other, and the output terminal (Q1) is connected to the signal input terminal of the subsequent D flip-flop circuit 203. The output terminal (Q1) of the D flip-flop circuit 202 outputs a second-bit signal. In the D flip-flop circuit 203, the input terminal (D) and the inverted output terminal (/Q) are electrically connected to each other, and the output terminal (Q2) of the D flip-flop circuit 203 outputs a third-bit signal.

A common preset signal PRESET is input from the offset adding circuit 112 to the preset terminal (S) of each D flip-flop circuit.

Figure 3:
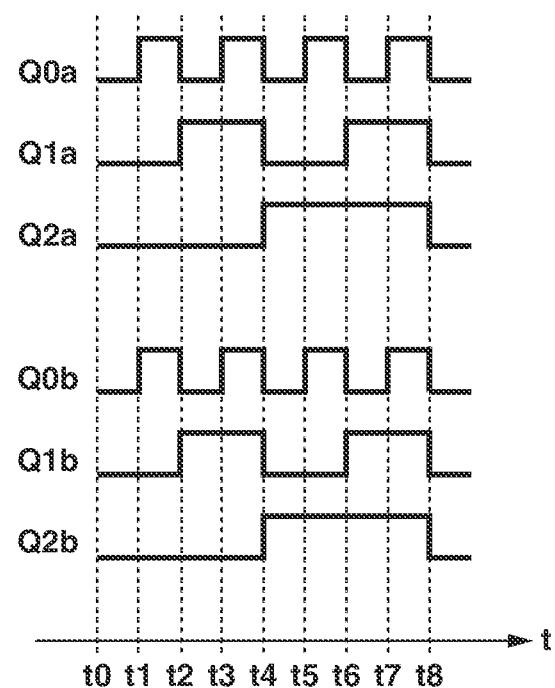
FIG. 3 is a diagram illustrating a comparative example of a counter operation to be applied to the first exemplary embodiment.

Next, a count operation of two counters (111a, 111b) will be described with reference to FIGS. 3 and 4. A case where amounts of offsets to be added to the respective counters are made the same, and a case where amounts of offsets to be added to the respective counters are made different will be separately described.

First of all, a counter operation to be performed in a case where offsets with the same offset amount are added to the counters will be described with reference to FIG. 3.

The counters 111a and 111b each output signal outputs Q0, Q1, and Q2. In FIG. 3, signal outputs Q0a, Q1a, and Q2a indicate outputs (first count value) of the counter 111a, and signal outputs Q0b, Q1b, and Q2b indicate outputs (second count value) of the counter 111b. In addition, the signal output Q0 is a least significant bit (LSB), and the signal output Q2 is a most significant bit (MSB).

At a time t0, as a count value, the counter 111a outputs a binary code "000", and as a count value, the counter 111b outputs a binary code "000". When light with a uniform light amount is emitted onto a surface on which photoelectric conversion elements are arrayed, by photoelectric conversion simultaneously occurring in pixel units connected to the respective counters, the counters 111a and 111b are incremented at the same time. From times t1 to t7 in FIG. 3, each counter is incremented one by one. At the time t7, the signal outputs Q0, Q1, and Q2 are all set to a high level (first level). Then, at a time t8, the signal outputs Q0, Q1, and Q2 are set to a low level (second level). At this time, by all outputs of both the counters 111a and 111b simultaneously switching to the low level, the source voltage DVDD connected to the counters momentarily varies drastically. This variation in the source voltage DVDD causes a count error in which a count value of each counter changes from a count value of photons to a different value, and might lead to image degradation such as unevenness and spots.

Next, an operation to be performed in a case where different offsets are added to the respective counters 111 of a plurality of pixel units will be described with reference to FIG. 4. Here, a first offset value indicating a binary code "000" is added to the counter 111a, and a second offset value indicating a binary code "011" is added to the counter 111b. The added offset values are examples, and offset values to be set are not limited to these.

At a time t0, the counter 111a has a value "000" and the counter 111b has a value "011". At a time t1, the counters are incremented by one, and the counter 111a has a value "001" and the counter 111b has a value "100". After the counters are incremented, at a time t4, a count value of the counter 111a becomes "010" and a count value of the counter 111b becomes "111". At a time t5, the counters are incremented and a count value of the counter 111a becomes "011". A count value of the counter 111b becomes "000", and the signal outputs Q0b, Q1b, and Q2b switch from the high level to the low level.

That is, by adding different offsets to two counters, a timing at which outputs drastically switch can be varied between the counters 111. This can prevent the source voltage DVDD from momentarily varying drastically, and prevent image degradation attributed to a count error.

Figure 4:
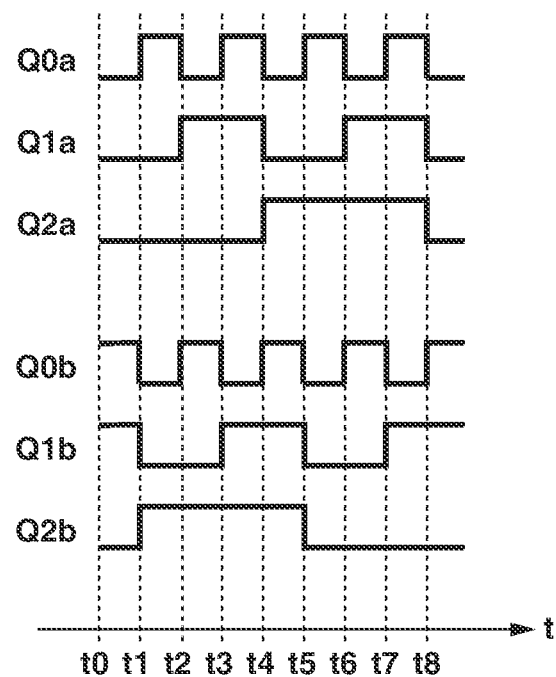
FIG. 4 is a diagram illustrating the description of a counter operation to be applied to the first exemplary embodiment.

From times t6 to t8 in FIG. 4, the counters 111 are incremented again. At the time t8, the outputs of the counter 111a drastically change from "111" to "000". Nevertheless, at this time, the outputs of the counter 111b change from "010" to "011". Hereinafter, a case where an output (Q1a) of a first flip-flop circuit included in the counter 111a, and an output (Q1b) of a second flip-flop circuit included in the counter 111b are compared will be described. It can also be said that, when an output signal of the first flip-flop circuit switches from a first level to a second level, an output signal of the second flip-flop circuit is maintained at either one of the first level or the second level. That is, timings at which count values of the two counters corresponding to the counters 111a and 111b switch drastically can be varied.

To add offsets to the respective counters 111, a photoelectric conversion element described in the present exemplary embodiment includes an offset adding circuit. By using the offset adding circuit, offsets different for the counters can be made settable. That is, by preventing outputs of a plurality of D flip-flop circuits included in each of the two counters, from simultaneously changing from the high level to the low level, and suppressing a variation in source voltage, a count error is prevented and image degradation can be further prevented.

Figure 5:
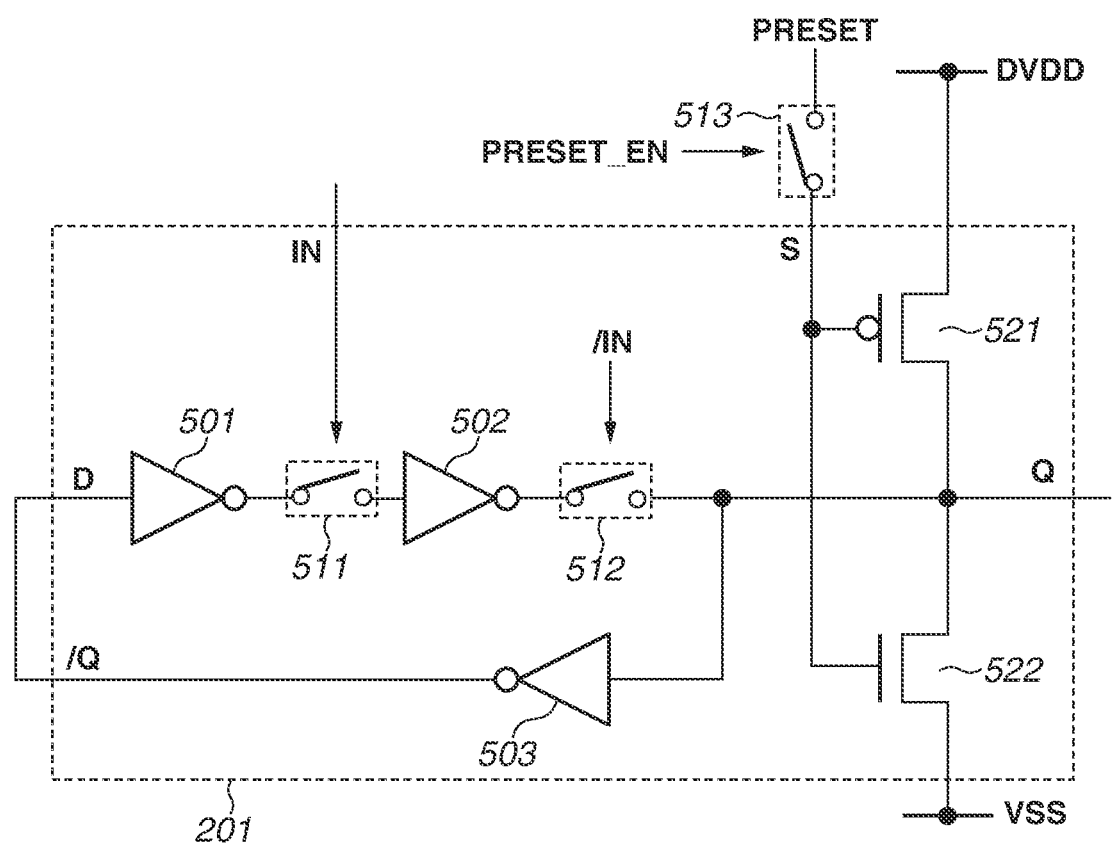
FIG. 5 is a diagram illustrating a configuration of a flip-flop circuit to be applied to the first exemplary embodiment.

An example of a configuration of the D flip-flop circuit 201 will be described with reference to FIG. 5. FIG. 5 illustrates a configuration example of the D flip-flop circuit 201 that uses NOT circuits 501, 502, and 503, switches 511, 512, and 513, a P-channel metal oxide semiconductor (PMOS) transistor 521, and an N-channel metal oxide semiconductor (NMOS) transistor 522. Circuit components for implementing a flip-flop operation are not limited to these. In the present exemplary embodiment, a D flip-flop circuit having a negative logic preset terminal will be described, but a D flip-flop circuit having a positive logic configuration may be used.

The electric connection of elements included in the D flip-flop circuit 201 will be described. An output terminal of the NOT circuit 501 is connected to one end of the switch 511, and the other terminal of the switch 511 is connected to an input terminal of the NOT circuit 502. An output terminal of the NOT circuit 502 is connected to one end of the switch 512, and the other terminal of the switch 512 becomes the output terminal (Q) of the D flip-flop circuit 201. In addition, the output terminal (Q) is connected to an input terminal of the NOT circuit 503. An output terminal of the NOT circuit 503 becomes the signal terminal (/Q) of the D flip-flop circuit 201, and is connected to an input end of the NOT circuit 501. Here, the input end of the NOT circuit 501 is the input signal terminal (D) of the D flip-flop circuit 201. The output terminal (Q) of the D flip-flop circuit 201 is connected to a drain terminal of the PMOS transistor 521, and a source terminal of the PMOS transistor 521 is connected to the source voltage DVDD. The output terminal Q of the D flip-flop circuit 201 is connected to a drain terminal of the NMOS transistor 522, and a source terminal of the NMOS transistor 522 is connected to the source voltage VSS. Gate terminals of the PMOS transistor 521 and the NMOS transistor 522 correspond to the preset input terminal (S) of the D flip-flop circuit 201, and are connected to one end of the switch 513. The preset signal PRESET is applied from the other terminal of the switch 513.

The switches 511 and 512 are respectively controlled in accordance with an input signal IN and an inverted input signal /IN obtained by inverting an input signal, and are turned on when these signals switch to the high level.

The switch 513 is controlled in accordance with a control signal PRESET_EN, and is turned on when the control signal PRESET_EN switches to the high level.

Figure 6:
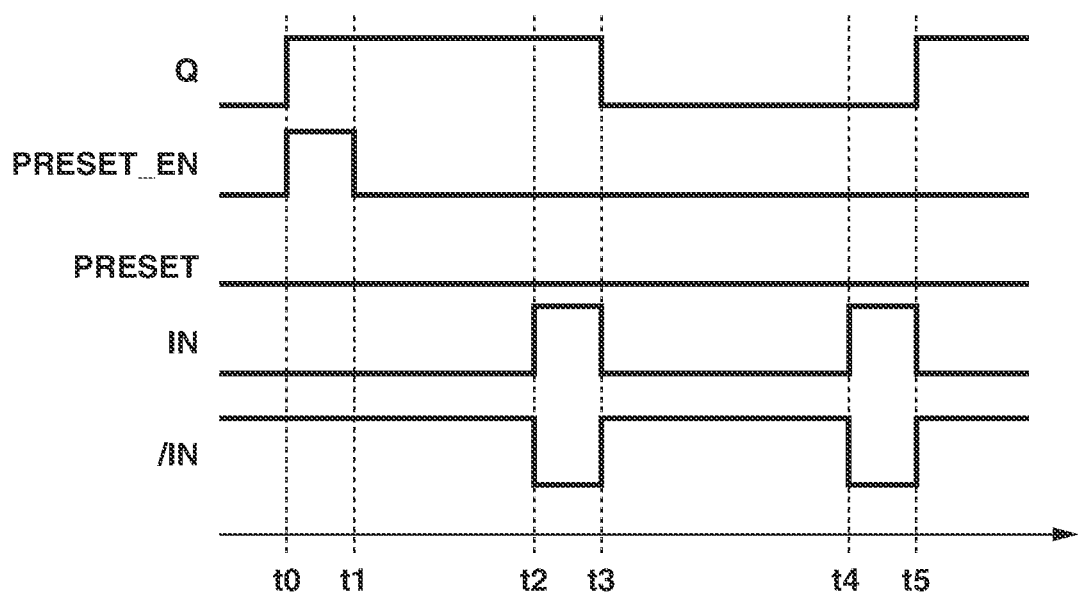
FIG. 6 is a diagram illustrating operation description of a flip-flop circuit to be applied to the first exemplary embodiment.

Next, an operation of the D flip-flop circuit 201 will be described with reference to a timing chart illustrated in FIG. 6.

First of all, at a time t0, the control signal PRESET_EN switches to the high level, and the switch 513 is turned on. By the switch 513 being turned on, a preset signal S is applied to the gates of the PMOS transistor 521 and the NMOS transistor 522. The signal output Q of the D flip-flop circuit 201 is thereby fixed to the high level or the low level in accordance with the potential level of PRESET. In this example, the preset signal S is set to the low level. At this time, by a low-level signal being applied to the gates of the PMOS transistor 521 and the NMOS transistor 522, the PMOS transistor 521 is turned on and the NMOS transistor 522 is turned off, and the signal output Q of the D flip-flop circuit 201 is fixed to the high level.

By the control signal PRESET_EN switching to the low level at a time t1, the switch 513 is turned off, and the D flip-flop circuit 201 operates as a flip-flop circuit in which an offset is recorded. At this time, because the signal output Q is set to the high level, the inverted output terminal /Q switches to the low level via the NOT circuit 503. Similarly, the output of the NOT circuit 501 switches to the high level. At a time t2, if the input signal IN switches to the high level and the switch 511 is turned on, a high-level signal is input to an input end of the NOT circuit 502, and a low-level signal is output from an output end of the NOT circuit 502. At a time t3, by the input signal IN switching to the low level and the inverted input signal /IN switching to the high level, the switch 512 is turned on, and a low-level signal is output as the signal output Q. In this manner, the D flip-flop circuit 201 can operate as a flip-flop circuit in which an output is stored in accordance with an input of a pulse. If a pulse is input again from times t4 to t5, the signal output Q switches to the high level, and the output is stored until the next pulse is applied.

In this manner, in the present exemplary embodiment, by providing an offset adding circuit and adding offsets to counters connected to the respective APDs, a time at which a potential level of a counter output switches is varied between the counters. This can suppress a variation in source voltage of the counters and a count error attributed to the variation, and prevent image degradation.

A second exemplary embodiment will be described mainly based on a difference from the first exemplary embodiment. In the present exemplary embodiment, an output of a counter and an output of an offset adding circuit may be input to a subtraction circuit, and a value obtained by subtracting an offset value from a counter output may be acquired as a count value.

Figure 7:
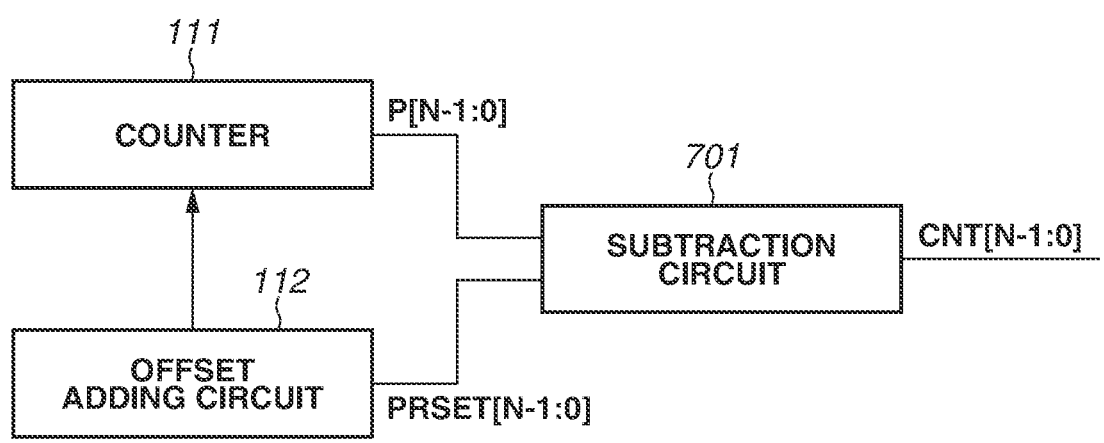
FIG. 7 is a block diagram of a subtraction circuit to be applied to a second exemplary embodiment.

A configuration of a photoelectric conversion element according to the present exemplary embodiment will be described with reference to FIG. 7. A subtraction circuit 701 is configured to receive, as input signals, an output of the counter 111 and an output of the offset adding circuit 112, and output a difference between the two input signals as an output signal.

A specific operation will be described with reference to a timing chart illustrated in FIG. 4. Immediately after the time t8, the counter 111a to which an offset value indicating a binary code "000" is added has a count value "000". On the other hand, the counter 111b to which an offset value indicating a binary code "110" is added has a count value "110".

Here, using the count value of the counter 111b, an operation of the subtraction circuit 701 will be described.

The count value "110" of the counter 111b and a value "110" set as an offset are input to the subtraction circuit 701. The subtraction circuit 701 performs subtraction processing of the input two values, and outputs a calculation result as a new signal CNT. In this example, the subtraction of the count value "110" and the offset value "110" is performed, and 000 is output as the signal CNT. The obtained value "000" is identical to a count value of the counter 111a to which "000" is added as an offset (i.e., no offset is added).

In this manner, by calculating a difference between an output value and an offset using a subtraction circuit, also in a case where an offset is added to the counter 111, it is possible to acquire a count value equivalent to a count value obtained in a case where 0 is added as an offset or in a case where no offset is added. In the configuration described in the second exemplary embodiment, because a count value not including an offset value is acquired, as compared with the first exemplary embodiment, a correction unit for excluding an offset need not be provided subsequently to a photoelectric conversion element.

According to the present exemplary embodiment, simultaneously with suppressing a variation in source voltage that occurs by output levels of a plurality of counters simultaneously switching, and preventing image degradation attributed to the variation, it is possible to acquire a count value not including an offset, from an output signal of a counter to which an offset is added.

A third exemplary embodiment will be described mainly based on a difference from the first and second exemplary embodiments. In the present exemplary embodiment, when an aggregate of a plurality of pixels is regarded as a pixel block, offset values different for blocks may be set for at least two pixel blocks.

Figure 8:
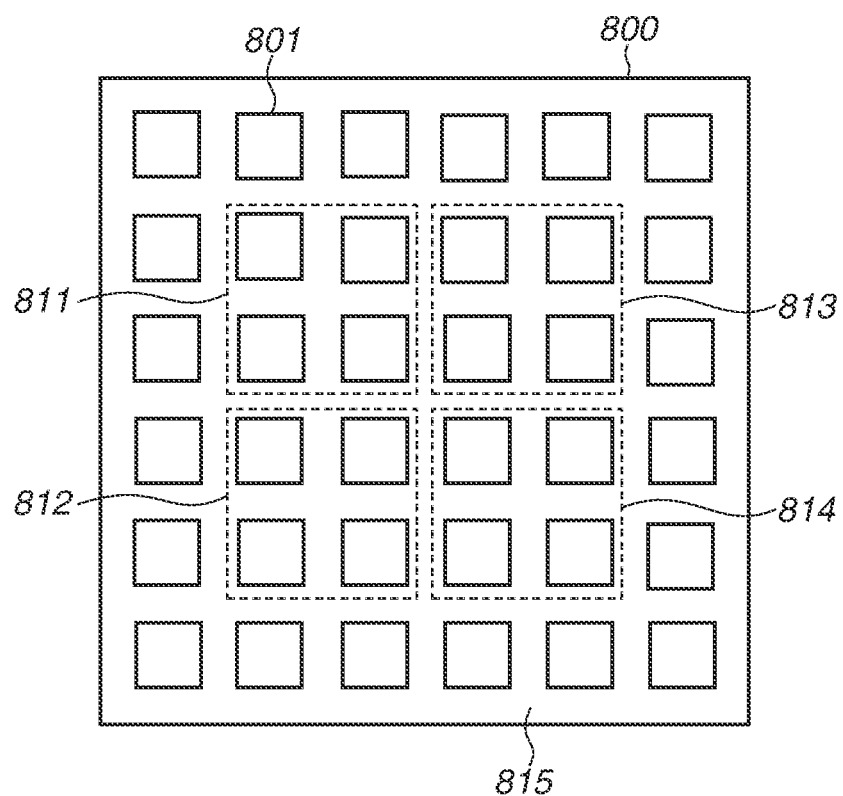
FIG. 8 is a schematic diagram of a photoelectric conversion apparatus to be applied to a third exemplary embodiment.
Figure 9:
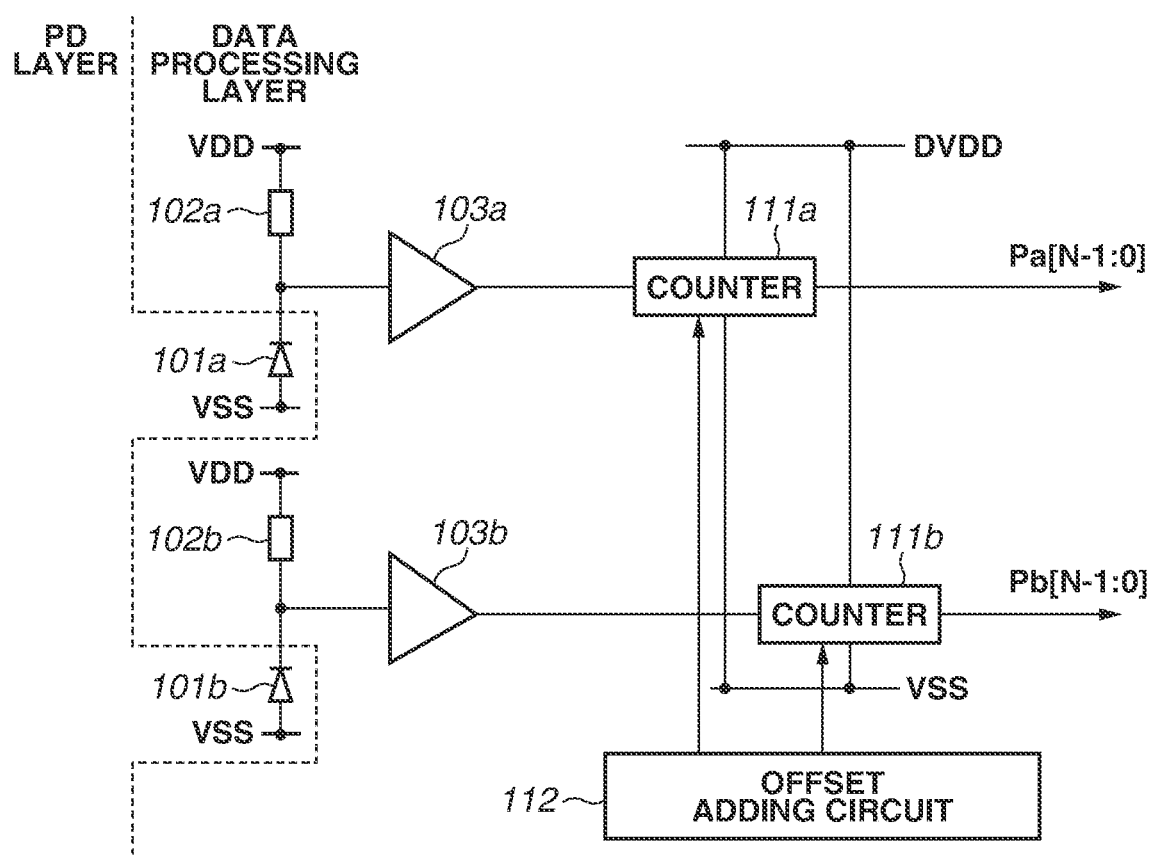
FIG. 9 is a schematic diagram to be applied to a fourth exemplary embodiment.

FIG. 8 is a schematic diagram of a pixel array including a plurality of pixels that is arranged in an array in a photoelectric conversion apparatus and is divided into arbitrary blocks. In this example, APDs 801 are arranged in a matrix having six rows and six columns, and pixel blocks 811, 812, 813, and 814 each including four pixels, and a pixel block 815 including 20 pixels are set as pixel blocks. In the present exemplary embodiment, pixels included in each of the pixel blocks have a common offset value in a corresponding pixel block. More specifically, four pixels included in the pixel block 811 (first pixel block) have a common offset value A, and 20 pixels included in the pixel block 815 (second pixel block) similarly have a common offset value B. In addition, pixels included in each of the pixel blocks 812 to 814 similarly have a common offset value in a corresponding pixel block. The present exemplary embodiment is effective for a photoelectric conversion apparatus including a pixel matrix having m rows and n columns (m, n are arbitrary integers), and the arrangement and a dividing way of pixel blocks are not limited.

According to the present exemplary embodiment, a region in which a potential level of a counter output is expected to switch drastically, such as a pixel array center part in which a subject appears in a large size is finely divided into blocks, and different offsets can be set for the divided regions. On the other hand, an offset value can be collectively set for a large region such as a pixel array outer peripheral part in which only a small part of the subject is included, and a potential level of a counter output is not expected to switch drastically. This can reduce the number of offsets to be set, and it becomes possible to reduce power consumption.

Counters included in photoelectric conversion elements in each pixel block may have a largest count value different for each pixel block. In other words, a largest count value of a counter may be varied in accordance with an offset value to be added to each counter. By varying a counter largest value in accordance with an offset value, a largest value of a value obtained by subtracting an offset value from a count value can be made equal irrespective of the offset value. Even in a case where offset values to be added to counters are equal, or in a case where an offset value is not added to each counter, by varying a counter largest value, it is possible to vary a timing at which a potential level of a counter output varies drastically. Nevertheless, in the case of varying a timing of a potential variation by varying only a counter largest value irrespective of an offset value, at a timing corresponding to the least common multiple of largest values of counters, a potential variation simultaneously occurs. Thus, it is desirable to make largest values of counters different after offset values are added to the counters.

In the first exemplary embodiment, because offsets are individually set for the counters 111 connected to the pixel units, different offsets are added also in a region in which a variation in potential level of a counter output is small. Nevertheless, in the region in which an output level is small, influence on image quality is small even without adding an offset, and there is no problem adding a common offset. With the configuration according to the present exemplary embodiment, it is possible to obtain an effect of preventing image degradation similarly to the first exemplary embodiment while reducing the number of offsets to be set, and power consumption.

FIGS. 9 to 12 are schematic diagram of a stack-type photoelectric conversion apparatus according to the present disclosure.

A photoelectric conversion element according to a fourth exemplary embodiment includes components similar to those in the first exemplary embodiment.

A photoelectric conversion apparatus 900 according to the present exemplary embodiment is a stack-type photoelectric conversion apparatus. The photoelectric conversion apparatus 900 includes a first substrate photodiode (PD) layer (sensor substrate 11), and a second substrate data processing layer (circuit substrate 21). Hereinafter, a photoelectric conversion apparatus having a configuration in which two substrates are stacked and electrically connected will be described as an example. The configuration of the photoelectric conversion apparatus 900 is not limited to this. For example, the photoelectric conversion apparatus 900 may be a photoelectric conversion apparatus in which components included in the sensor substrate 11 to be described below, and components included in the circuit substrate 21 are arranged in a common semiconductor layer. Alternatively, the photoelectric conversion apparatus 900 may be a photoelectric conversion apparatus in which components included in the circuit substrate 21 are arranged on yet another substrate. In the present exemplary embodiment, by providing an offset adding circuit on the circuit substrate 21, it is possible to ensure a pixel area on the sensor substrate 11, and an effect of further improving image quality is obtained.

The sensor substrate 11 includes a first semiconductor layer including the pixel unit 100 to be described below, and a first wiring structure. The circuit substrate 21 includes a second semiconductor layer including a circuit such as the signal processing circuit unit 110 to be described below, and a second wiring structure. The photoelectric conversion apparatus 900 includes the second semiconductor layer, the second wiring structure, the first wiring structure, and the first semiconductor layer, which are stacked in this order.

Figure 10:
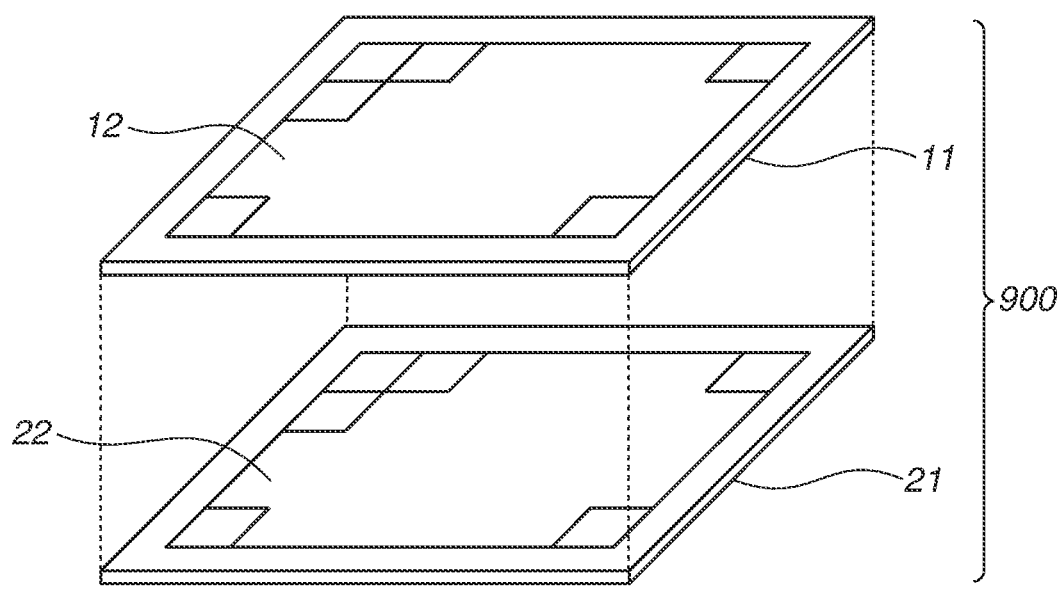
FIG. 10 is a diagram illustrating a configuration of a photoelectric conversion apparatus according to the fourth exemplary embodiment.

FIG. 10 illustrates a back-illuminated photoelectric conversion apparatus that receives light entering from a first surface, and includes a circuit substrate arranged on a second surface being a surface opposite to the first surface. In a case where the photoelectric conversion apparatus 900 is a non-stacked photoelectric conversion apparatus, a surface on which a transistor of a signal processing circuit is arranged will be referred to as a second surface. In a case where the photoelectric conversion apparatus 900 is a back-illuminated photoelectric conversion apparatus, the first surface of a semiconductor layer that faces the second surface serves as a light incidence surface. In a case where the photoelectric conversion apparatus 900 is a front-illuminated photoelectric conversion apparatus, the second surface of a semiconductor layer serves as a light incidence surface.

In the following description, the sensor substrate 11 and the circuit substrate 21 will be described as singulated chips, but the sensor substrate 11 and the circuit substrate 21 are not limited to such chips. For example, each substrate may be a wafer. Alternatively, the substrates may be singulated after being stacked in a wafer state, or may be singulated into chips and then jointed by stacking the chips.

A pixel region 12 is arranged on the sensor substrate 11, and a circuit region 22 for processing signals detected in the pixel region 12 is arranged on the circuit substrate 21.

Figure 11:
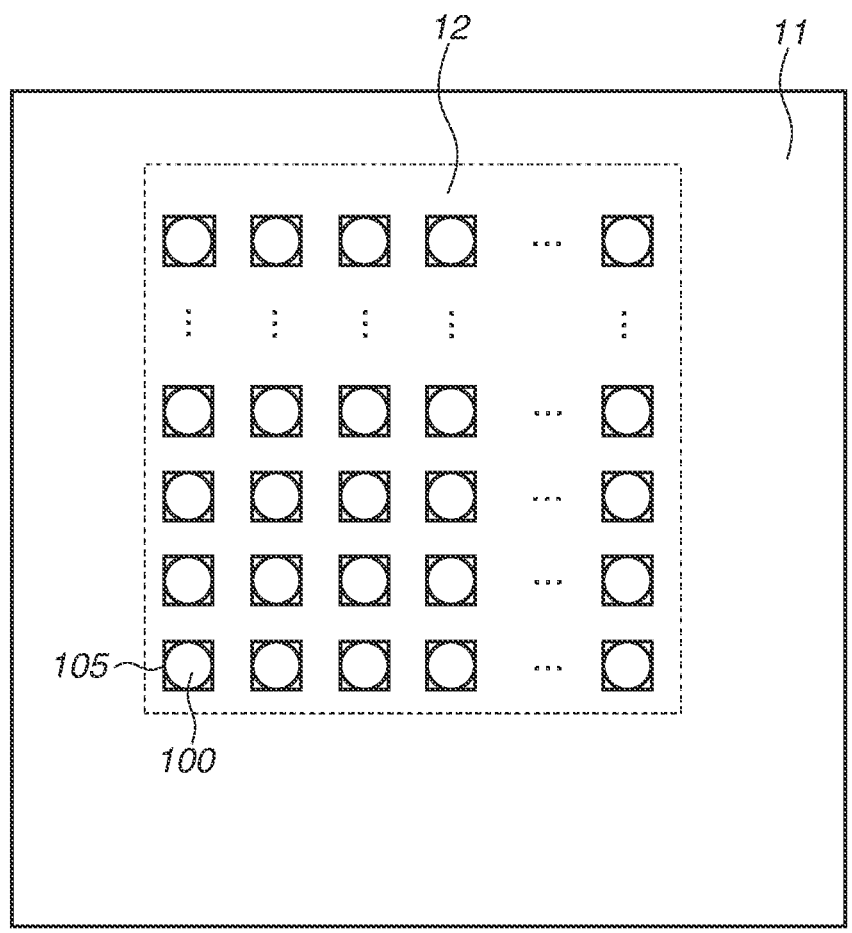
FIG. 11 is a diagram illustrating the arrangement of a sensor chip of the photoelectric conversion apparatus according to the fourth exemplary embodiment.

FIG. 11 is a diagram illustrating an arrangement example of the sensor substrate 11. Pixels 105 each including the pixel unit 100 including an APD are arranged in a two-dimensional array in a planar view, and form the pixel region 12.

Typically, the pixel 105 is a pixel for forming an image. In a case where the pixel 105 is used in a time of flight (TOF) sensor, an image need not be always formed. That is, the pixel 105 may be a pixel for measuring a time at which light reaches, and for measuring a light amount.

Figure 12:
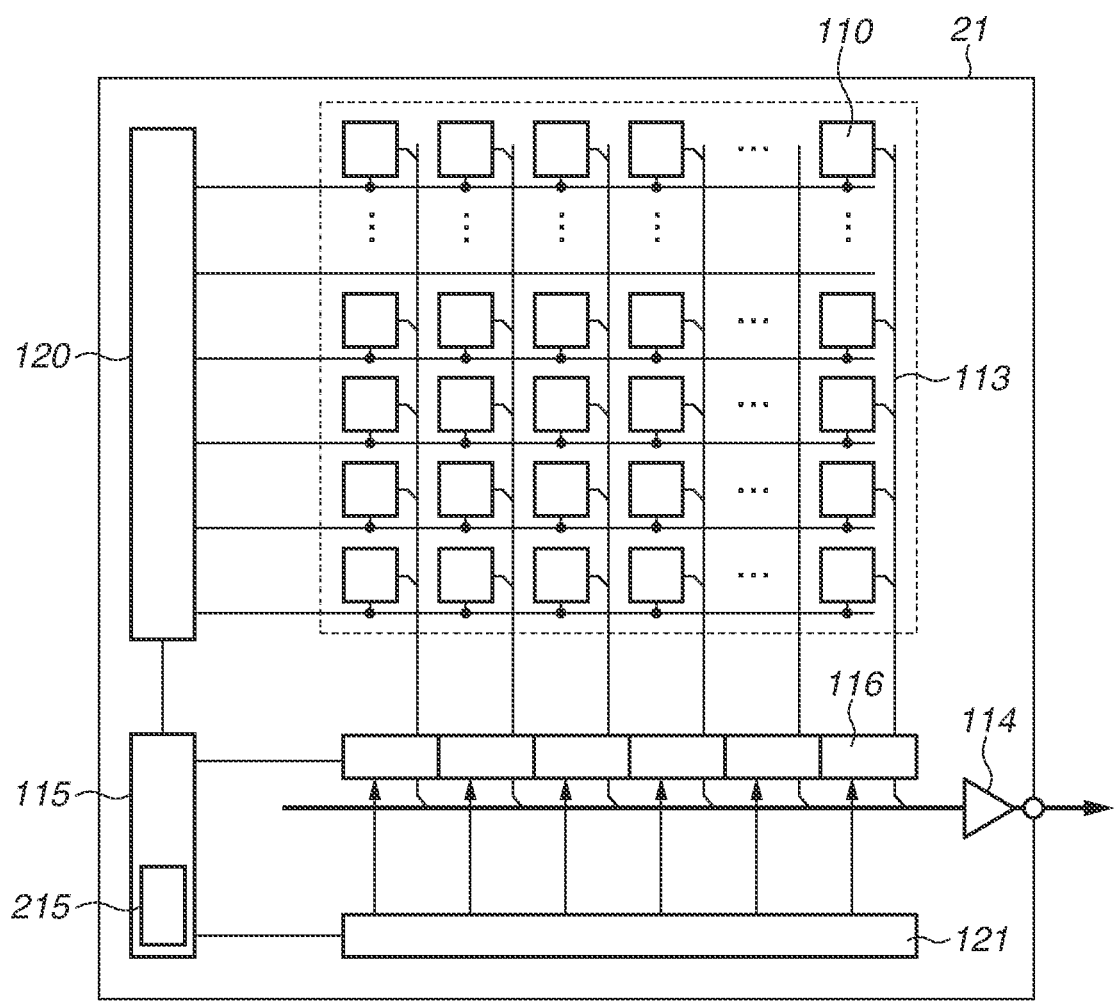
FIG. 12 is a diagram illustrating a configuration of a circuit chip of the photoelectric conversion apparatus according to the fourth exemplary embodiment.

FIG. 12 is a configuration diagram of the circuit substrate 21. The circuit substrate 21 includes the signal processing circuit unit 110 that processes charges photoelectrically-converted by the pixel unit 100 illustrated in FIG. 11, a readout circuit 116, a control pulse generation circuit or unit 115, a horizontal scanning circuit or unit 121, a signal line 113, and a vertical scanning circuit or unit 120.

The pixel unit 100 illustrated in FIG. 11 and the signal processing circuit unit 110 illustrated in FIG. 12 are electrically connected via a connection wire provided for each pixel.

The vertical scanning circuit unit 120 receives a control pulse supplied from the control pulse generation unit 115, and supplies the control pulse to each pixel. A logic circuit such as a shift register or an address decoder is used as the vertical scanning circuit unit 120.

The control pulse generation unit 115 includes a signal generation unit 215 that generates a control signal P_CLK of a switch, which will be described below. As described below, the signal generation unit 215 generates a pulse signal for controlling the switch. As illustrated in FIG. 13A, for example, the signal generation unit 215 may generate a common control signal P_CLK for a plurality of pixels in a pixel region, or as illustrated in FIG. 13B, the signal generation unit 215 may generate the control signal P_CLK for each pixel. In a case where the signal generation unit 215 generates the common pulse signal P_CLK, the signal generation unit 215 generates the control signal P_CLK in common in such a manner that at least any one of a cycle of a pulse signal P_EXP for controlling an exposure period, the number of pulses, and a pulse width is associated with an exposure period. In a case where the signal generation unit 215 controls the control signal P_CLK for each pixel, the signal generation unit 215 can generate a signal using both of an input signal P_CLK_IN output from the control pulse generation unit 115, and the signal P_EXP for controlling an exposure period. The control pulse generation unit 115 desirably includes a frequency divider circuit, for example. This enables simple control and can reduce an increase in the number of elements.

A signal output from the pixel unit 100 of a pixel is processed by the signal processing circuit unit 110. A counter and a memory are provided in the signal processing circuit unit 110, and a digital value is stored in the memory.

The horizontal scanning circuit unit 121 inputs, to the signal processing circuit unit 110, a control pulse for sequentially selecting each column to read out a signal from the memory of each pixel that stores a digital signal.

A signal is output to the signal line 113 from the signal processing circuit unit 110 corresponding to a pixel selected by the vertical scanning circuit unit 120 on a selected column.

The signal output to the signal line 113 is output via an output circuit 114 to a recording unit or a signal processing unit that is provided on the outside of the photoelectric conversion apparatus 900.

In FIG. 11, photoelectric conversion elements in a pixel region may be one-dimensionally arrayed. Even in a case where the number of pixels is one, the effect of the present disclosure can be obtained, and a case where the number of pixels is one is also included in the present disclosure. Nevertheless, if a photoelectric conversion apparatus includes a plurality of pixels, a power consumption reduction effect of the present exemplary embodiment can be obtained more easily. The function of the signal processing unit need not be provided for each of all photoelectric conversion elements. For example, one signal processing unit may be shared by a plurality of photoelectric conversion elements, and signal processing may be sequentially performed.

As illustrated in FIGS. 11 and 12, a plurality of signal processing circuit units 110 is arranged in a region overlapping the pixel region 12 in a planar view. Then, the vertical scanning circuit unit 120, the horizontal scanning circuit unit 121, the readout circuit 116, the output circuit 114, and the control pulse generation unit 115 are arranged in such a manner as to overlap, in a planar view, a region defined by the ends of the sensor substrate 11 and the ends of the pixel region 12. In other words, the sensor substrate 11 includes the pixel region 12, and a non-pixel region arranged around the pixel region 12. Then, the vertical scanning circuit unit 120, the horizontal scanning circuit unit 121, the readout circuit 116, the output circuit 114, and the control pulse generation unit 115 are arranged in a region overlapping the non-pixel region in a planar view.

The arrangement of the signal lines 113, and the arrangement of the readout circuit 116 and the output circuit 114 are not limited to those illustrated in FIG. 12. For example, the signal lines 113 may be arranged with extending in a row direction, and the readout circuit 116 may be arranged at the ends of the extending signal lines 113.

Each APD 101 of the photoelectric conversion apparatuses according to the first to fourth exemplary embodiments may be a so-called clock-recharge-type APD.

Figure 13A:
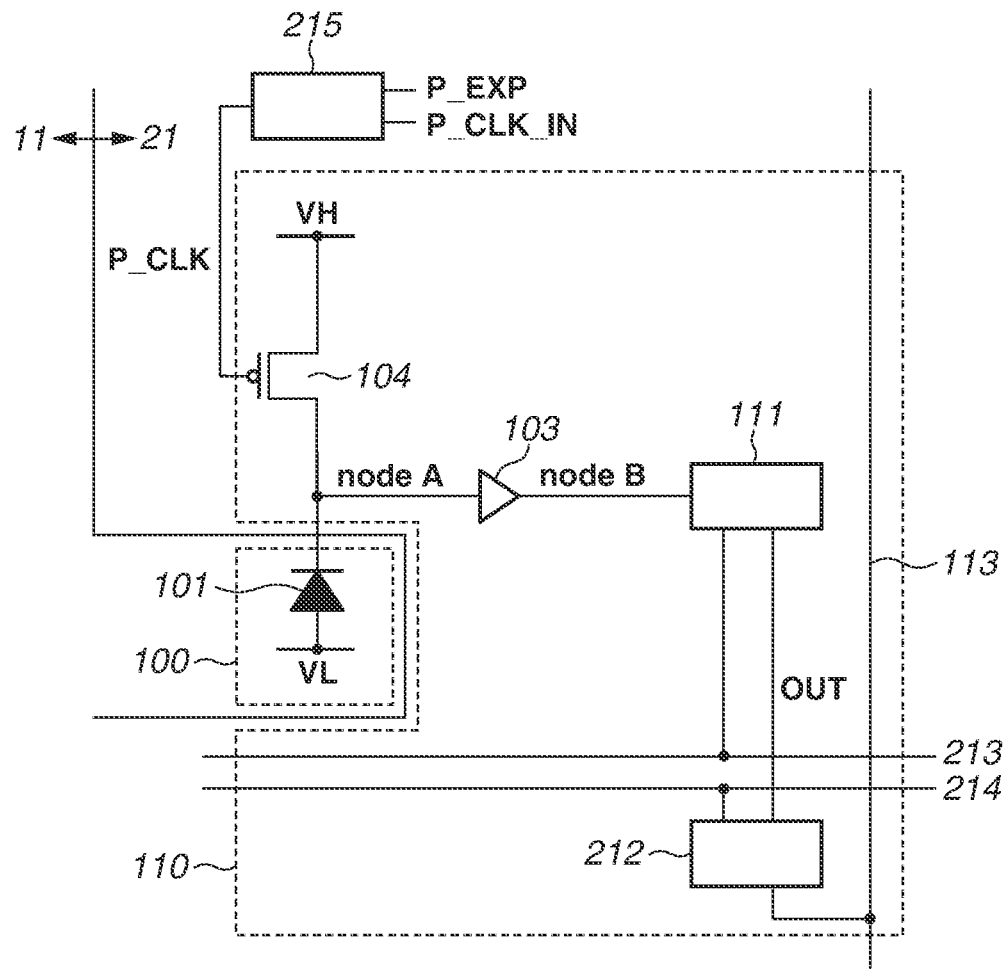
FIGS. 13A and 13B are block diagrams including an equivalent circuit of a photoelectric conversion element of a photoelectric conversion apparatus according to a fifth exemplary embodiment.
Figure 13B:
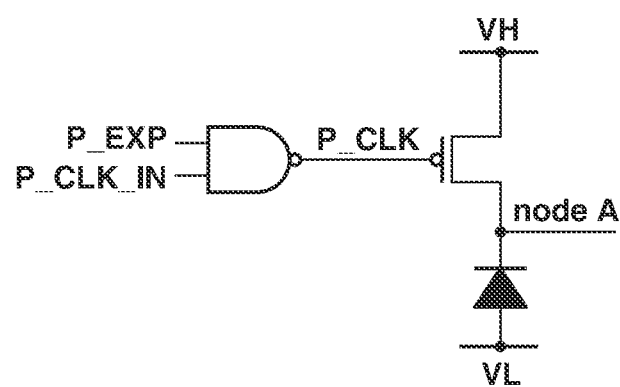

FIGS. 13A and 13B illustrate an example of a block diagram including an equivalent circuit of FIGS. 11 and 12. FIG. 13A illustrates an example in which the signal generation unit 215 is provided in common to a plurality of pixels, and FIG. 13B illustrates an example in which the control signal P_CLK can be controlled for each pixel.

In FIGS. 13A and 13B, the pixel unit 100 including the APD 101 is provided on the sensor substrate 11, and other members are provided on the circuit substrate 21.

The APD 101 generates a charge pair corresponding to incident light, by photoelectric conversion. One node of two nodes of the APD 101 is connected to a control line to which a drive voltage VL (first voltage) is supplied. The other node of the two nodes of the APD 101 is connected to a control line to which a drive voltage VH (second voltage) higher than the drive voltage VL supplied to the anode is supplied. In FIGS. 13A and 13B, one node of the APD 101 is an anode, and the other node of the APD 101 is a cathode. Inversely-biased voltages for causing the APD 101 to perform an avalanche multiplication operation are supplied to the anode and the cathode of the APD 101. By causing a state in which such voltages are supplied, charges generated by incident light cause avalanche multiplication, and an avalanche current is generated.

In a case where inversely-biased voltages are supplied, an APD is operated in a Geiger mode or a linear mode. In the Geiger mode, an APD is operated with a potential difference between the anode and the cathode that is larger than a breakdown voltage. In the linear mode, an APD is operated with a potential difference between the anode and the cathode that is near a breakdown voltage, or with a voltage difference equal to or smaller than the breakdown voltage.

An APD operated in the Geiger mode will be referred to as an SPAD. For example, the drive voltage VL (first voltage) is −30 V and the drive voltage VH (second voltage) is 1 V. The APD 101 may be operated in the linear mode, or may be operated in the Geiger mode. Because a potential difference of the SPAD becomes larger and a voltage proof effect of the SPAD becomes more prominent as compared with an APD in the linear mode, the SPAD is desirably used.

A switch 104 is connected to the control line to which the drive voltage VH is supplied, and the APD 101. The switch 104 is connected to one node of the anode and the cathode of the APD 101.

Then, the switch 104 switches a potential difference between the anode and the cathode of the APD 101, between a first potential difference that causes avalanche multiplication, and a second potential difference that does not cause avalanche multiplication. Hereinafter, switching the potential difference from the second potential difference to the first potential difference will also be referred to as turning the switch 104 on, and switching the potential difference from the first potential difference to the second potential difference will also be referred to as turning the switch 104 off. The switch 104 functions as a quench element. The switch 104 functions as a load circuit (quench circuit) when a signal is multiplied by avalanche multiplication, and has a function of suppressing avalanche multiplication by suppressing a voltage to be supplied to the APD 101 (quench operation). The switch 104 also has a function of returning a voltage to be supplied to the APD 101, to a predetermined potential (drive voltage VH) by flowing a current by an amount corresponding to a voltage drop caused by the quench operation (recharge operation). That is, the switch 104 functions as a control circuit that controls the occurrence of avalanche multiplication in the APD 101.

The switch 104 can include a metal-oxide semiconductor (MOS) transistor, for example. FIGS. 13A and 13B illustrate a case where the switch 104 is a PMOS transistor. The control signal P_CLK of the switch 104 that is supplied from the signal generation unit 215 is applied to a gate electrode of the MOS transistor included in the switch 104. In the present exemplary embodiment, by controlling an applied voltage to the gate electrode of the switch 104, Turning on and off of the switch 104 are controlled.

The signal processing circuit 110 includes the pulse conversion unit 103, the counter circuit 111, and a selection circuit 212. In FIGS. 13A and 13B, the signal processing circuit unit 110 includes the pulse conversion unit 103, the counter circuit 111, and the selection circuit 212. In this specification, the signal processing circuit unit 110 is only required to include at least any one of the pulse conversion unit 103, the counter circuit 111, and the selection circuit 212.

The pulse conversion unit 103 outputs a pulse signal by shaping a potential change of the cathode of the APD 101 that is obtained at the time of photon detection. An input side node of the pulse conversion unit 103 is regarded as a node A and an output side node is regarded as a node B. The pulse conversion unit 103 changes an output potential from the node B depending on whether an input potential to the node A is equal to or larger than a predetermined value or lower than the predetermined value. For example, in FIG. 14, if an input potential to the node A becomes a high potential equal to or larger than a determination threshold value, an output potential from the node B becomes a low level. Then, if an input potential to the node A becomes a potential lower than the determination threshold value, an output potential from the node B becomes a high level. For example, an inverter circuit is used as the pulse conversion unit 103. FIG. 13A illustrates an example in which one inverter is used as the pulse conversion unit 103, but a circuit in which a plurality of inverters is connected in series may be used, or another circuit having a waveform shaping effect may be used.

The quench operation and the recharge operation can be performed using the switch 104 in accordance with avalanche multiplication in the APD 101, but in some cases, a photon is not determined as an output signal depending on the detection timing of the photon. For example, when avalanche multiplication occurs in an APD, the potential at the node A becomes the low level, and the recharge operation is being performed, the determination threshold value of the pulse conversion unit 103 is generally set to a potential higher than a potential difference at which avalanche multiplication occurs in an APD. If a photon enters when a potential at the node A is set to a potential lower than the determination threshold value due to the recharge operation, and is set to a potential at which avalanche multiplication can occur in an APD, avalanche multiplication occurs in an APD, and a voltage at the node A drops. In other words, because the potential at the node A drops at a voltage lower than the determination threshold value, although a photon is detected, an output potential from the node B does not change. Accordingly, although avalanche multiplication occurs, a photon stops being determined as a signal. Especially under high illuminance, because photons consecutively enter in a short period, the photons become difficult to be determined as signals. For this reason, in spite of the high illuminance, a discrepancy easily arises between the number of actual incident photons and the number of output signals.

In contrast to this, by switching between on and off of the switch 104 by applying the control signal P_CLK to the switch 104, also in a case where photons consecutively enter an APD in a short time, the photons can be determined as signals. An example in which the control signal P_CLK is a pulse signal output at a repeat cycle will be described with reference to FIG. 14. In other words, a configuration in which the switch 104 is turned on/off at a predetermined clock frequency will be described with reference to FIG. 14. Nevertheless, an effect of suppressing an increase in power consumption of a photoelectric conversion apparatus can be obtained even if a pulse signal is not a signal output at a repeat cycle.

The counter circuit 111 counts the number of pulse signals output from the pulse conversion unit 103, and stores a count value. When a control pulse pRES is supplied via a drive line 213, the number of pulse signals that is stored in the counter circuit 111 is reset.

A control pulse pSEL is supplied to the selection circuit 212 from the vertical scanning circuit unit 120 illustrated in FIG. 12, via a drive line 214 illustrated in FIG. 13A (not illustrated in FIG. 12), and electric connection and separation between the counter circuit 111 and the signal line 113 are switched. The selection circuit 212 includes a buffer circuit for outputting a signal, for example. An output signal OUT illustrated in FIG. 13A is a signal output from a pixel.

Electric connection may be switched by arranging a switch such as a transistor between the switch 104 and the APD 101, or between the pixel unit 100 and the signal processing circuit unit 110. Similarly, the supply of the drive voltage VH or the drive voltage VL to be supplied to the pixel unit 100 may be electrically switched using a switch such as a transistor.

As illustrated in FIG. 13B, the signal generation unit 215 may be provided for each pixel. In FIG. 13B, the illustration of the pulse conversion unit 103, a circuit following the pulse conversion unit 103, and the signal generation unit 215, which are illustrated in FIG. 13A, is omitted. The signal generation unit 215 in FIG. 13A is assumed to be provided for each pixel. In FIG. 13B, a logic circuit is provided in a pixel, and whether to supply a pulse signal to the switch 104 is determined. The signal P_EXP for controlling an exposure period, and an input signal P_CLK_IN for controlling the control signal P_CLK are input to the logic circuit. Then, an inverted signal is output. For example, in a case where the signal P_EXP for controlling an exposure period is at a low level and the input signal P_CLK_IN is at a low level, a high-level signal is output as the control signal P_CLK. In other words, the switch 104 is turned off. In a case where the signal P_EXP for controlling an exposure period is at a high level and the input signal P_CLK_IN is at a high level, a low-level signal is output as the control signal P_CLK. In other words, the switch 104 is turned on. In addition, in a case where one of the signal P_EXP for controlling an exposure period and the input signal P_CLK_IN is at the low level, a high-level signal is output as the control signal P_CLK. In other words, the switch 104 is turned off. In this manner, it is desirable to control the switch 104 for each pixel. In a case where the circuit illustrated in FIG. 13B is used, if an exposure period P becomes a low level, the control signal P_CLK is maintained at the high level. In other words, the switch 104 is turned off.

Figure 14:
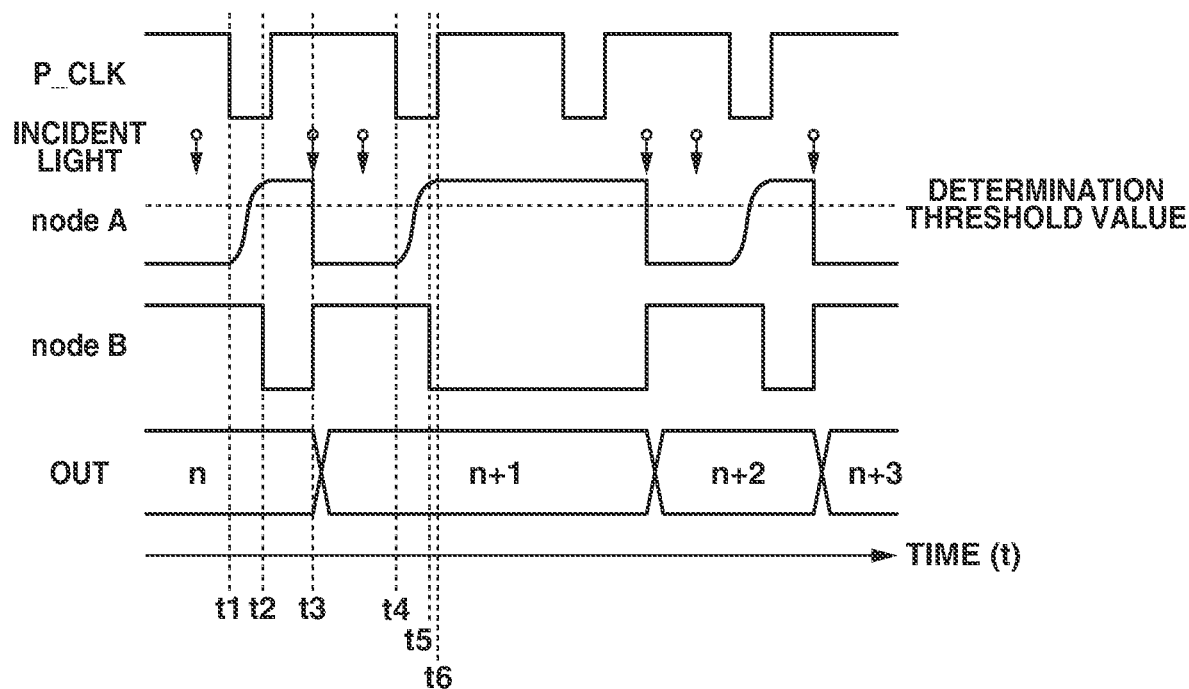
FIG. 14 is a diagram illustrating a relationship between an operation of an avalanche photodiode (APD) of the photoelectric conversion apparatus according to the fifth exemplary embodiment, and an output signal.

FIG. 14 is a diagram schematically illustrating a relationship between the control signal P_CLK of the switch 104, a potential at the node A, a potential at the node B, and an output signal. In the present exemplary embodiment, in a case where the control signal P_CLK is at the high level, the drive voltage VH becomes less likely to be supplied to an APD, and in a case where the control signal P_CLK is at the low level, the drive voltage VH is supplied to an APD. The high level of the control signal P_CLK is 1 V, for example, and the low level of the control signal P_CLK is 0 V, for example. In a case where the control signal P_CLK is at the high level, the switch 104 is turned off, and in a case where the control signal P_CLK is at the low level, the switch 104 is turned on. A resistance value of the switch 104 that is set in a case where the control signal P_CLK is at the high level becomes higher than a resistance value of the switch 104 that is set in a case where the control signal P_CLK is at the low level. In a case where the control signal P_CLK is at the high level, because the recharge operation is less likely to be performed even if avalanche multiplication occurs in an APD, a potential to be supplied to the APD becomes a potential equal to or smaller than a breakdown voltage of the APD. Accordingly, an avalanche multiplication operation in the APD stops.

As illustrated in FIGS. 13A and 13B, it is desirable that the switch 104 includes one transistor, and the quench operation and the recharge operation are performed using the one transistor. With this configuration, as compared with a case where the quench operation and the recharge operation are performed using different circuit elements, the number of circuits can be reduced. Especially in a case where each pixel includes a counter circuit, and a signal of an SPAD is read out for each pixel, to arrange the counter circuits, it is desirable to reduce a circuit area used for a switch, and an effect obtained by configuring the switch 104 using one transistor becomes prominent.

At a time t1, the control signal P_CLK changes from a high level to a low level, the switch 104 is turned on, and the recharge operation of the APD 101 is started (recharge state). A potential at the cathode of the APD 101 thereby transitions to a high level. Then, a potential difference between potentials to be applied to the anode and the cathode of the APD 101 becomes a state in which avalanche multiplication can occur. A potential at the cathode is the same as the potential at the node A. Accordingly, when the potential at the cathode transitions from a low level to a high level, at a time t2, the potential at the node A becomes equal to or larger than the determination threshold value. At this time, a pulse signal output from the node B is reversed from a high level to a low level. After that, a potential difference corresponding to (the drive voltage VH–the drive voltage VL) is applied to the APD 101. The control signal P_CLK becomes the high level, and the switch 104 is turned off.

Next, if a photon enters the APD 101 at a time t3, avalanche multiplication occurs in the APD 101, and a voltage at the cathode drops. In other words, a voltage at the node A drops. If a voltage drop amount further increases, and a voltage difference to be applied to the APD 101 becomes smaller, avalanche multiplication of the APD 101 stops as in the time t2, and a voltage level at the node A stops dropping from a certain fixed value. If the voltage at the node A becomes lower than the determination threshold value while the voltage at the node A is dropping, a voltage at the node B changes from a low level to a high level. In other words, a portion with an output waveform exceeding the determination threshold at the node A is subjected to waveform shaping performed by the pulse conversion unit 103, and output as a signal at the node B. Then, the signal is counted by the counter circuit 111, and a count value of counted signals that is to be output from the counter circuit 111 is incremented by 1 LSB.

A photon enters the APD 101 during a period between times t3 and t4, but the switch 104 is in an off state, the node A is in a floating state (standby state), and an applied voltage to the APD 101 does not have a potential difference at which avalanche multiplication can occur. Thus, a voltage level at the node A does not exceed the determination threshold value.

At the time t4, the control signal P_CLK changes from the high level to a low level, and the switch 104 is turned on. A current compensating for a voltage drop from the drive voltage VH accordingly flows to the node A, and the voltage at the node A transitions to the original voltage level. At this time, because the voltage at the node A becomes equal to or larger than the determination threshold value at a time t5, a pulse signal at the node B is reversed from the high level to the low level.

At a time t6, the voltage level at the node A is statically settled at the original voltage level, and the control signal P_CLK changes from the low level to the high level. Accordingly, the switch 104 is turned off. Subsequently, potentials at each node and signal lines also change in accordance with the control signal P_CLK and photon entrance as described using the times t1 to t6.

Figure 15:
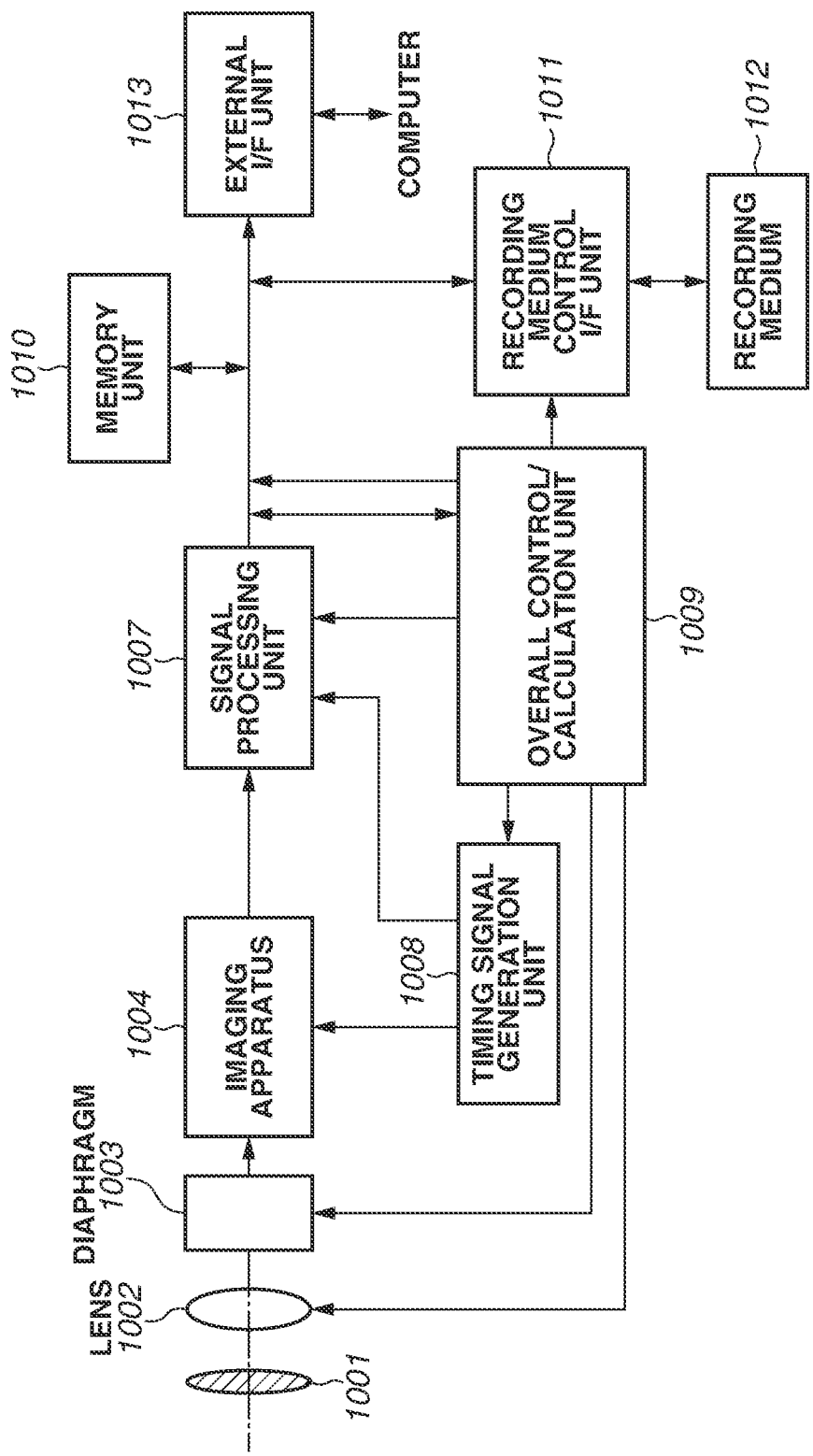
FIG. 15 is a functional block diagram of a photoelectric conversion system according to a sixth exemplary embodiment.

A photoelectric conversion system according to a sixth exemplary embodiment will be described with reference to FIG. 15. FIG. 15 is a block diagram illustrating a schematic configuration of a photoelectric conversion system according to the present exemplary embodiment.

The photoelectric conversion apparatus described in the above-described first to fifth exemplary embodiments can be applied to various photoelectric conversion systems. Examples of photoelectric conversion systems to which the photoelectric conversion apparatus can be applied include a digital still camera, a digital camcorder, a monitoring camera, a copier, a facsimile, a mobile phone, an in-vehicle camera, and an observation satellite. A camera module including an optical system such as a lens, and an imaging apparatus is also included in the photoelectric conversion system. As an example of these photoelectric conversion systems, FIG. 15 exemplarily illustrates a block diagram of a digital still camera.

The photoelectric conversion system exemplified in FIG. 15 includes an imaging apparatus 1004 serving as an example of the photoelectric conversion apparatus, and a lens 1002 that forms an optical image of a subject on the imaging apparatus 1004. The photoelectric conversion system further includes a diaphragm 1003 for varying an amount of light passing through the lens 1002, and a barrier 1001 for protecting the lens 1002. The lens 1002 and the diaphragm 1003 serve as an optical system that condenses light onto the imaging apparatus 1004. The imaging apparatus 1004 is the photoelectric conversion apparatus according to any of the above-described exemplary embodiments, and converts an optical image formed by the lens 1002, into an electric signal.

The photoelectric conversion system further includes a signal processing unit 1007 serving as an image generation unit that generates an image by processing an output signal output by the imaging apparatus 1004. The signal processing unit 1007 performs an operation of outputting image data after performing various types of correction and compression as necessary. The signal processing unit 1007 may be formed on a semiconductor substrate on which the imaging apparatus 1004 is provided, or may be formed on a semiconductor substrate different from that of the imaging apparatus 1004. The photoelectric conversion system further includes a memory unit 1010 for temporarily storing image data, and an external interface unit (external I/F unit) 1013 for communicating with an external computer. The photoelectric conversion system further includes a recording medium 1012 such as a semiconductor memory for recording or reading out captured image data, and a recording medium control interface unit (recording medium control I/F unit) 1011 for performing recording onto or readout from the recording medium 1012. The recording medium 1012 may be built into the photoelectric conversion system, or may be detachably attached to the photoelectric conversion system.

The photoelectric conversion system further includes an overall control/calculation unit 1009 that controls various types of calculation and the entire digital still camera, and a timing signal generation unit 1008 that outputs various timing signals to the imaging apparatus 1004 and the signal processing unit 1007. The timing signals may be input from the outside. The photoelectric conversion system is only required to include at least the imaging apparatus 1004 and the signal processing unit 1007 that processes an output signal output from the imaging apparatus 1004.

The imaging apparatus 1004 outputs an imaging signal to the signal processing unit 1007. The signal processing unit 1007 outputs image data after performing predetermined signal processing on the imaging signal output from the imaging apparatus 1004. The signal processing unit 1007 generates an image using the imaging signal.

In this manner, according to the present exemplary embodiment, a photoelectric conversion system to which the photoelectric conversion apparatus (imaging apparatus) according to any of the above-described exemplary embodiments is applied can be realized.

Figure 16A:
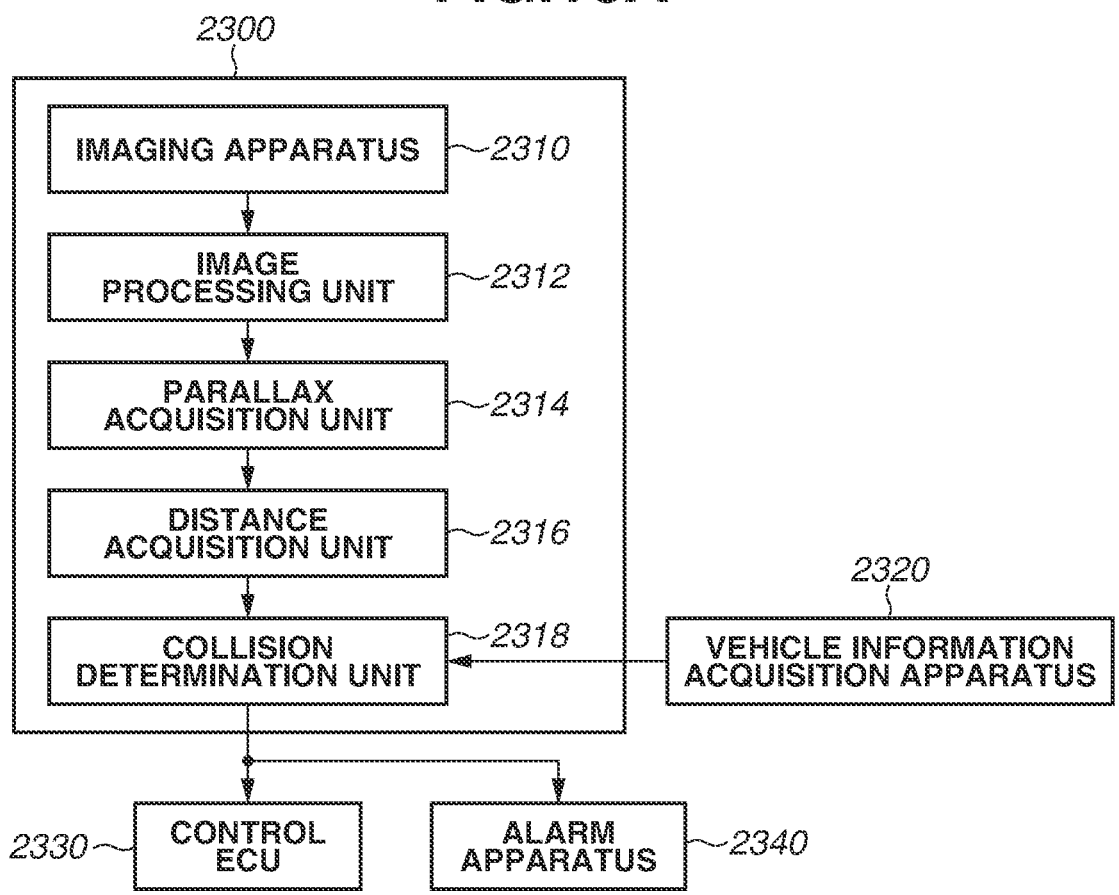
FIGS. 16A and 16B are functional block diagrams of a photoelectric conversion system according to a seventh exemplary embodiment.
Figure 16B:
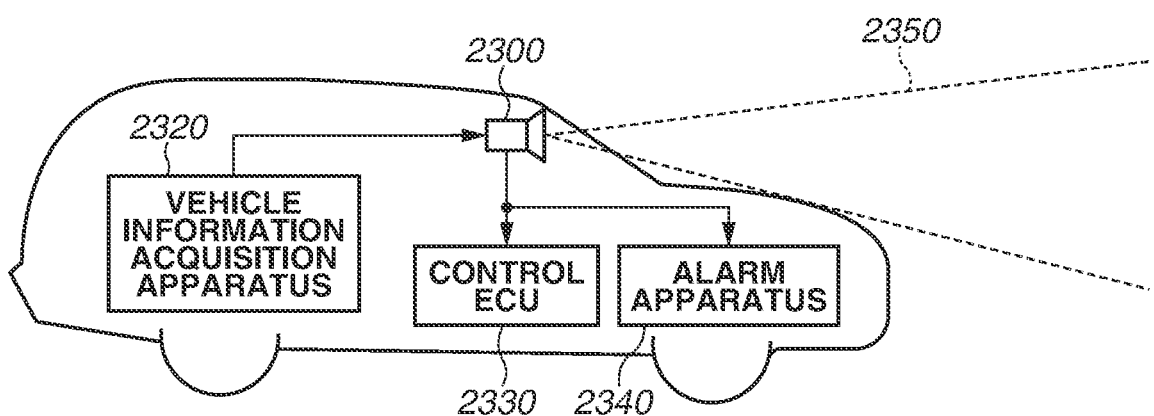

A photoelectric conversion system and a movable body according to a seventh exemplary embodiment will be described with reference to FIGS. 16A and 16B. FIGS. 16A and 16B are diagrams illustrating configurations of the photoelectric conversion system and the movable body according to the present exemplary embodiment.

FIG. 16A illustrates an example of a photoelectric conversion system related to an in-vehicle camera. A photoelectric conversion system 2300 includes an imaging apparatus 2310. The imaging apparatus 2310 is the photoelectric conversion apparatus according to any of the above-described exemplary embodiments. The photoelectric conversion system 2300 includes an image processing unit 2312 that performs image processing on a plurality of pieces of image data acquired by the imaging apparatus 2310. The photoelectric conversion system 2300 further includes a parallax acquisition unit 2314 that calculates a parallax (phase difference between parallax images) from the plurality of pieces of image data acquired by the photoelectric conversion system 2300. The photoelectric conversion system 2300 further includes a distance acquisition unit 2316 that calculates a distance to a target object based on the calculated parallax, and a collision determination unit 2318 that determines whether collision is likely to occur, based on the calculated distance. In this example, the parallax acquisition unit 2314 and the distance acquisition unit 2316 serve as an example of a distance information acquisition unit that acquires distance information regarding a distance to a target object. More specifically, the distance information is information regarding a parallax, a defocus amount, and a distance to a target object. The collision determination unit 2318 may determine collision likelihood using any of these pieces of distance information. The distance information acquisition unit may be implemented by dedicatedly-designed hardware, or may be implemented by a software module.

Alternatively, the distance information acquisition unit may be implemented by a field programmable gate array (FPGA) or an application specific integrated circuit (ASIC), or may be implemented by the combination of these.

The photoelectric conversion system 2300 is connected to a vehicle information acquisition apparatus 2320, and can acquire vehicle information such as vehicle speed, a yaw rate, or a rudder angle. In addition, a control electronic control unit (ECU) 2330 is connected to the photoelectric conversion system 2300. The ECU 2330 serves as a control unit that outputs a control signal for generating braking force, to a vehicle based on a determination result obtained by the collision determination unit 2318. The photoelectric conversion system 2300 is also connected with an alarm apparatus 2340 that raises an alarm to a driver based on a determination result obtained by the collision determination unit 2318. For example, if the determination result obtained by the collision determination unit 2318 indicates high collision likelihood, the control ECU 2330 performs vehicle control for avoiding collision or reducing damages by braking, releasing a gas pedal, or suppressing engine output. The alarm apparatus 2340 issues an alarm to a user by sounding an alarm such as warning sound, displaying warning information on a screen of a car navigation system, or vibrating a seatbelt or a steering wheel.

In the present exemplary embodiment, the photoelectric conversion system 2300 captures an image of the periphery of the vehicle such as the front side or the rear side, for example. FIG. 16B illustrates the photoelectric conversion system 2300 for capturing an image of a vehicle front side (imaging range 2350). The vehicle information acquisition apparatus 2320 issues an instruction to the photoelectric conversion system 2300 or the imaging apparatus 2310. With this configuration, the accuracy of distance measurement can be further enhanced.

The above description has been given of an example in which control is performed in such a manner as not to collide with another vehicle. The photoelectric conversion system can also be applied to the control for performing automatic operation by following another vehicle, or the control for performing automatic operation in such a manner as not to deviate from a lane. Furthermore, the photoelectric conversion system can be applied to a movable body (moving apparatus) such as a vessel, an aircraft, or an industrial robot aside from a vehicle such as an automobile. Moreover, the photoelectric conversion system can be applied to a device that extensively uses object recognition, such as an intelligent transport system (ITS), in addition to a movable body.

Figure 17:
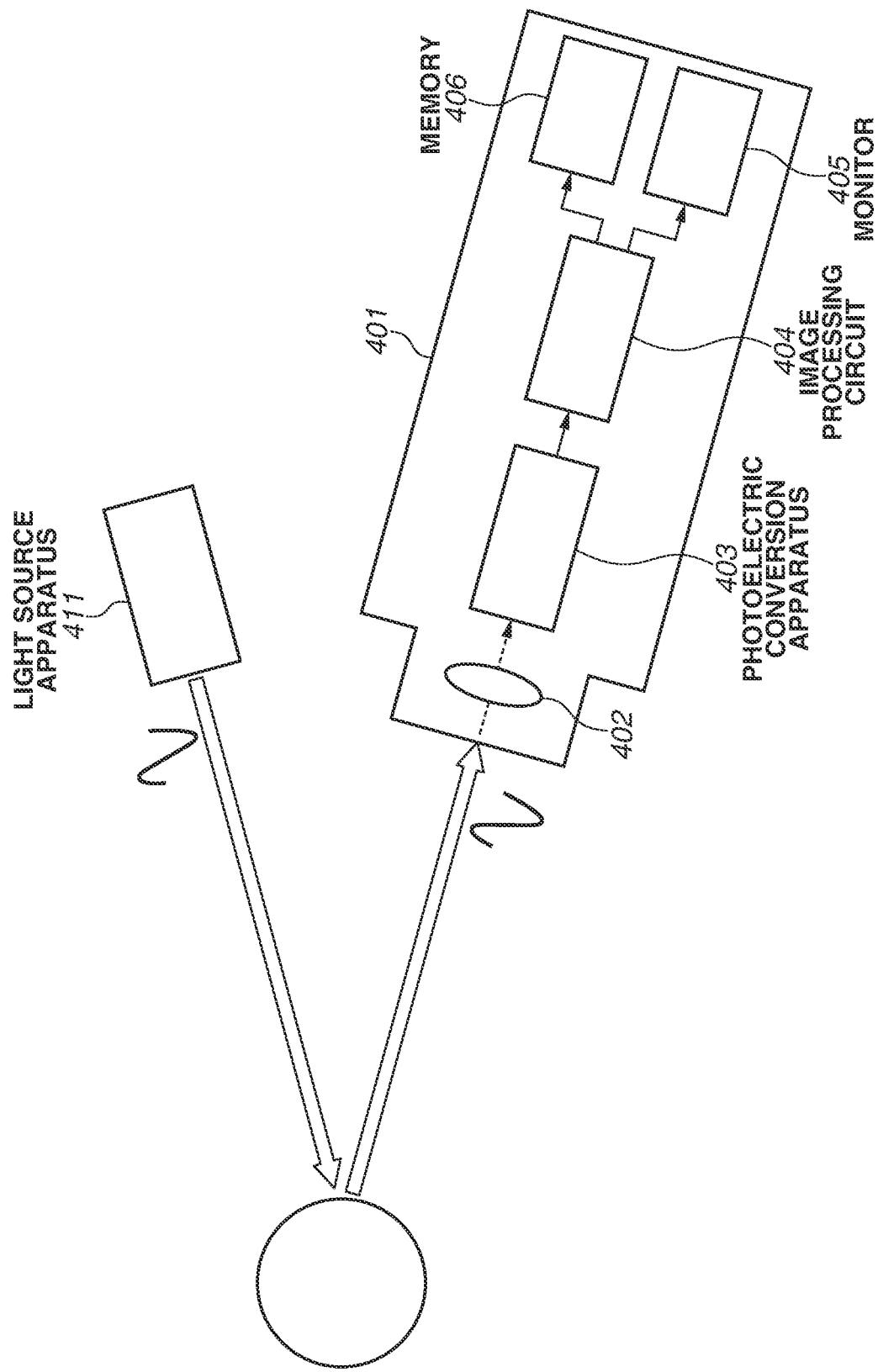
FIG. 17 is a functional block diagram of a photoelectric conversion system according to an eighth exemplary embodiment.

A photoelectric conversion system according to an eight exemplary embodiment will be described with reference to FIG. 17. FIG. 17 is a block diagram illustrating a configuration example of a distance image sensor serving as the photoelectric conversion system according to the present exemplary embodiment.

As illustrated in FIG. 17, a distance image sensor 401 includes an optical system 402, a photoelectric conversion apparatus 403, an image processing circuit 404, a monitor 405, and a memory 406. The distance image sensor 401 can acquire a distance image corresponding to a distance to a subject by receiving light (modulated light or pulse light)

that has been projected from a light source apparatus 411 toward the subject, and reflected on the front surface of the subject.

The optical system 402 includes one or a plurality of lenses, and forms an image on a light receiving surface (sensor portion) of the photoelectric conversion apparatus 403 by guiding image light (incident light) from the subject to the photoelectric conversion apparatus 403.

The photoelectric conversion apparatus described in each of the above exemplary embodiments is applied to the photoelectric conversion apparatus 403, and a distance signal indicating a distance obtained from a light receiving signal output from the photoelectric conversion apparatus 403 is supplied to the image processing circuit 404.

The image processing circuit 404 performs image processing of constructing a distance image, based on the distance signal supplied from the photoelectric conversion apparatus 403. Then, a distance image (image data) obtained by the image processing is supplied to the monitor 405 and displayed thereon, or supplied to the memory 406 and stored (recorded) therein.

By applying the above-described photoelectric conversion apparatus, the distance image sensor 401 having the above-described configuration can acquire a more accurate distance image in accordance with characteristic enhancement of a pixel, for example.

Figure 18:
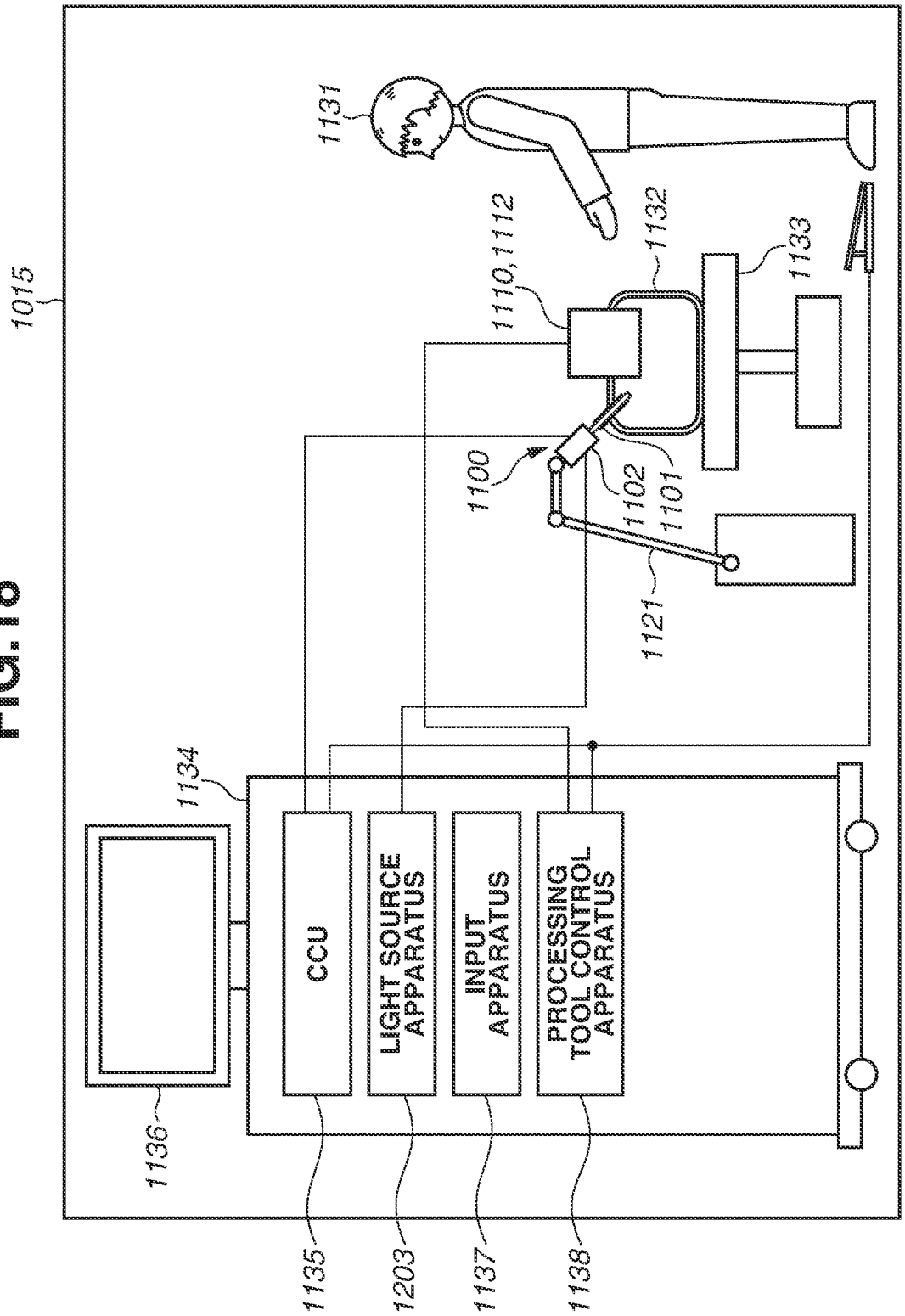
FIG. 18 is a functional block diagram of a photoelectric conversion system according to a ninth exemplary embodiment.

A photoelectric conversion system according to a ninth exemplary embodiment will be described with reference to FIG. 18. FIG. 18 is a diagram illustrating an example of a schematic configuration of an endoscopic operation system serving as a photoelectric conversion system of the present exemplary embodiment.

FIG. 18 illustrates a state in which an operator (doctor) 1131 is performing an operation on a patient 1132 lying on a patient bed 1133, using an endoscopic operation system 1150. As illustrated in FIG. 18, the endoscopic operation system 1150 includes an endoscope 1100, a surgical tool 1110, and a cart 1134 equipped with various apparatuses for an endoscopic operation.

The endoscope 1100 includes a lens barrel 1101 having a region to be inserted into a body cavity of the patient 1132 by a predetermined length from a distal end, and a camera head 1102 connected to a proximal end of the lens barrel 1101. In the example illustrated in FIG. 18, the endoscope 1100 formed as a so-called rigid scope including the rigid lens barrel 1101 is illustrated, but the endoscope 1100 may be formed as a so-called flexible scope including a flexible lens barrel.

An opening portion into which an objective lens is fitted is provided at the distal end of the lens barrel 1101. A light source apparatus 1203 is connected to the endoscope 1100, and light generated by the light source apparatus 1203 is guided to the distal end of the lens barrel 1101 by a light guide extended inside the lens barrel 1101, and emitted onto an observation target in the body cavity of the patient 1132 via the objective lens. The endoscope 1100 may be a direct view endoscope, or may be an oblique view endoscope or a lateral view endoscope.

An optical system and a photoelectric conversion apparatus are provided inside the camera head 1102. Reflected light (observation light) from an observation target is condensed by the optical system to the photoelectric conversion apparatus. The observation light is photoelectrically-converted by the photoelectric conversion apparatus, and an electric signal corresponding to the observation light (i.e., image signal corresponding to an observed image) is generated. The photoelectric conversion apparatus described in each of the above exemplary embodiments can be used as the photoelectric conversion apparatus. The image signal is transmitted to a camera control unit (CCU) 1135 as RAW data.

The CCU 1135 includes a central processing unit (CPU) or a graphics processing unit (GPU), and comprehensively controls operations of the endoscope 1100 and a display device 1136. Furthermore, the CCU 1135 receives an image signal from the camera head 1102, and performs various types of image processing for displaying an image that is based on the image signal, such as development processing (demosaic processing), on the image signal.

Based on the control from the CCU 1135, the display device 1136 displays an image that is based on an image signal on which image processing has been performed by the CCU 1135.

The light source apparatus 1203 includes a light source such as a light emitting diode (LED), and supplies irradiating light for capturing an image of an operative site, to the endoscope 1100.

An input apparatus 1137 is an input interface for the endoscopic operation system 1150. A user can input various types of information and instructions to the endoscopic operation system 1150 via the input apparatus 1137.

A processing tool control apparatus 1138 controls the driving of an energy processing tool 1112 for cauterizing or cutting a tissue, or sealing a blood vessel.

The light source apparatus 1203 that supplies irradiating light for capturing an image of an operative site, to the endoscope 1100 can include, for example, an LED, a laser light source, or a white light source including a combination of these. In a case where a white light source includes a combination of RGB laser light sources, because output intensity and an output timing of each color (each wavelength) can be controlled highly accurately, white balance of a captured image can be adjusted in the light source apparatus 1203. In this case, by emitting laser light from each RGB laser light source onto an observation target in a time division manner, and controlling the driving of an image sensor of the camera head 1102 in synchronization with the emission timing, an image corresponding to each of RGB can be captured in a time division manner. According to the method, a color image can be obtained without providing a color filter in the image sensor.

The driving of the light source apparatus 1203 may be controlled in such a manner as to change the intensity of light to be output, every predetermined time. By acquiring images in a time division manner by controlling the driving of the image sensor of the camera head 1102 in synchronization with the change timing of the light intensity, and combining the images, it is possible to generate a high dynamic range image without so-called underexposure and overexposure.

The light source apparatus 1203 may be configured to supply light in a predetermined wavelength band adapted to special light observation. In the special light observation, for example, wavelength dependency of light absorption in body tissues is utilized. Specifically, by emitting light in a narrower band as compared with irradiating light (i.e., white light) in normal observation, an image of a predetermined tissue such as a blood vessel of a superficial portion of a mucous membrane is captured with high contrast.

Alternatively, in special light observation, fluorescent observation of obtaining an image by fluorescence generated by emitting excitation light may be performed. In the fluorescent observation, fluorescence from a body tissue can be observed by emitting excitation light onto the body tissue, or a fluorescent image can be obtained by locally injecting reagent such as indocyanine green (ICG) into a body tissue and emitting excitation light suitable for a fluorescence wavelength of the reagent, onto the body tissue. The light source apparatus 1203 can be configured to supply narrow-band light and/or excitation light adapted to such special light observation.

Figure 19A:
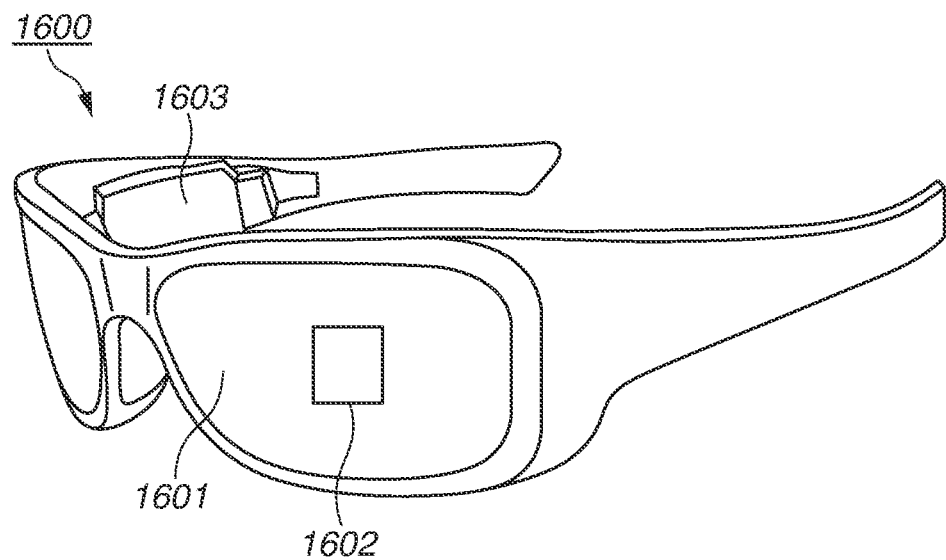
FIGS. 19A and 19B are functional block diagrams of a photoelectric conversion system according to a tenth exemplary embodiment.

A photoelectric conversion system according to a tenth exemplary embodiment will be described with reference to FIGS. 19A and 19B. FIG. 19A is a diagram illustrating eyeglasses 1600 (smart glasses) serving as the photoelectric conversion system according to the present exemplary embodiment. The eyeglasses 1600 include a photoelectric conversion apparatus 1602. The photoelectric conversion apparatus 1602 is the photoelectric conversion apparatus described in each of the above-described exemplary embodiments. A display device including a light emission device such as an organic light emitting diode (OLED) or an LED may be provided on the back surface side of a lens 1601. The number of photoelectric conversion apparatuses 1602 may be one or plural. A plurality of types of photoelectric conversion apparatuses may be used in combination. An arrangement position of the photoelectric conversion apparatus 1602 is not limited to the position illustrated in FIG. 19A.

The eyeglasses 1600 further include a control apparatus 1603. The control apparatus 1603 functions as a power source that supplies power to the photoelectric conversion apparatus 1602 and the above-described display device. The control apparatus 1603 controls operations of the photoelectric conversion apparatus 1602 and the display device. In the lens 1601, an optical system for condensing light to the photoelectric conversion apparatus 1602 is formed.

Figure 19B:
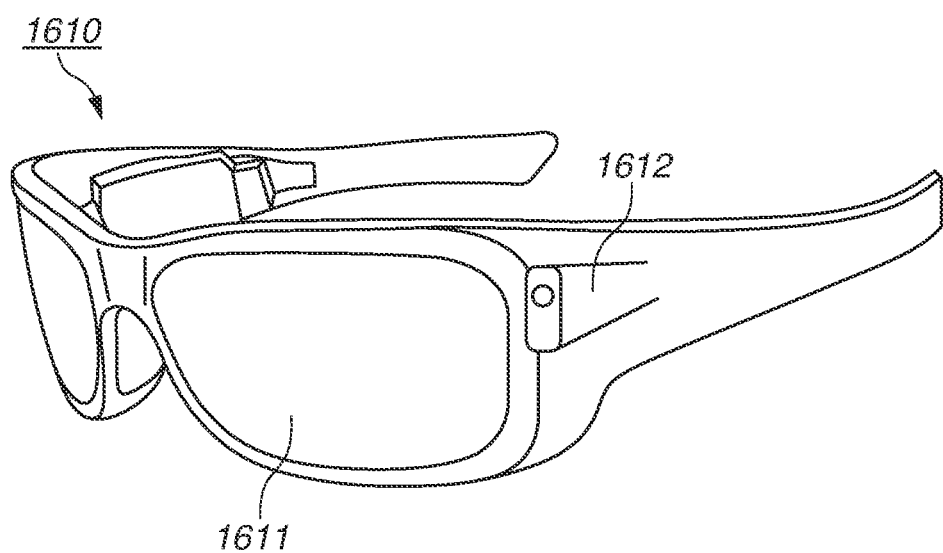

FIG. 19B illustrates eyeglasses 1610 (smart glasses) according to one application example. The eyeglasses 1610 include a control apparatus 1612, and the control apparatus 1612 is equipped with a photoelectric conversion apparatus equivalent to the photoelectric conversion apparatus 1602, and a display device. In a lens 1611, an optical system for projecting light emitted from the photoelectric conversion apparatus and the display device in the control apparatus 1612 is formed, and an image is projected onto the lens 1611. The control apparatus 1612 functions as a power source that supplies power to the photoelectric conversion apparatus and the display device, and controls operations of the photoelectric conversion apparatus and the display device. The control apparatus 1612 may include a visual line detection unit that detects a visual line of a wearer. Infrared light may be used for the detection of a visual line. An infrared light emission unit emits infrared light onto an eyeball of a user looking at a displayed image. An imaging unit including a light receiving element detects reflected light of the emitted infrared light that has been reflected from the eyeball. A captured image of the eyeball is thereby obtained. By including a reduction unit for reducing light from the infrared light emission unit to a display unit in a planar view, a decline in image quality is suppressed.

From a captured image of an eyeball obtained by image capturing using infrared light, a visual line of a user with respect to a displayed image is detected. An arbitrary known method can be applied to visual line detection that uses a captured image of an eyeball. As an example, a visual line detection method that is based on a Purkinje image obtained by reflection of irradiating light on a cornea can be used.

More specifically, visual line detection processing that is based on the pupil center corneal reflection is performed. By calculating an eye vector representing the direction (rotational angle) of an eyeball based on an image of a pupil and a Purkinje image that are included in a captured image of the eyeball, using the pupil center corneal reflection, a visual line of a user is detected.

The display device of the present exemplary embodiment includes the photoelectric conversion apparatus including a light receiving element, and a displayed image of the display device may be controlled based on visual line information of the user from the photoelectric conversion apparatus.

Specifically, in the display device, a first eyeshot region viewed by the user, and a second eyeshot region other than the first eyeshot region are determined based on the visual line information. The first eyeshot region and the second eyeshot region may be determined by a control apparatus of the display device, or the first eyeshot region and the second eyeshot region determined by an external control apparatus may be received. In a display region of the display device, a display resolution of the first eyeshot region may be controlled to be higher than a display resolution of the second eyeshot region. In other word, a resolution of the second eyeshot region may be made lower than a resolution of the first eyeshot region.

The display region includes a first display region and a second display region different from the first display region. Based on the visual line information, a region with high priority may be determined from the first display region and the second display region. The first display region and the second display region may be determined by a control apparatus of the display device, or the first display region and the second display region determined by an external control apparatus may be received. A resolution of a region with high priority may be controlled to be higher than a resolution of a region other than the region with high priority. In other words, a resolution of a region with relatively-low priority may be set to a low resolution.

Artificial intelligence (AI) may be used to determine the first eyeshot region and the region with high priority. The AI may be a model configured to estimate an angle of a visual line, and a distance to a target existing at the end of the visual line, from an image of an eyeball using teaching data including an image of the eyeball, and a direction in which the eyeball in the image actually gives a gaze. An AI program may be included in the display device, may be included in the photoelectric conversion apparatus, or may be included in an external apparatus. In a case where an external apparatus includes an AI program, the AI program is transmitted to the display device via communication.

In a case where display control is performed based on visual line detection, the disclosure can be desirably applied to smart glasses further including a photoelectric conversion apparatus that captures an image of the outside. The smart glasses can display external information obtained by image capturing, in real time.

Modified Exemplary Embodiment

The present disclosure is not limited to the above-described exemplary embodiments, and various modifications can be made.

For example, an example in which a partial configuration of a certain exemplary embodiment is added to another exemplary embodiment, and an example in which a partial configuration of a certain exemplary embodiment is replaced with a partial configuration of another exemplary embodiment are also included in the exemplary embodiments of the present disclosure.

The photoelectric conversion systems described in the above-described sixth and seventh exemplary embodiments are examples of a photoelectric conversion system to which a photoelectric conversion apparatus is applicable, and the configuration of the photoelectric conversion system to which the photoelectric conversion apparatus of the present disclosure is applicable is not limited to the configurations illustrated in FIGS. 15 to 16. The same applies to the ToF system described in the eighth exemplary embodiment, the endoscope described in the ninth exemplary embodiment, and the smart glasses described in the tenth exemplary embodiment.

The above-described exemplary embodiments merely indicate specific examples for implementing the present disclosure, and the technical scope of the present disclosure is not to be construed in a limited manner based on these exemplary embodiments. That is, the present disclosure can be implemented in various forms without departing from the technical idea thereof or the main feature thereof.

According to the present disclosure, it is possible to provide a photoelectric conversion apparatus in which a variation in source voltage connected to a counter is suppressed.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-185024, filed Nov. 18, 2022, which is hereby incorporated by reference herein in its entirety.

What is claimed is:

1. A photoelectric conversion apparatus comprising:
a first pixel including a first avalanche photodiode, and a first count circuit configured to count a first signal that is based on the number of photons that have entered the first avalanche photodiode;
a second pixel including a second avalanche photodiode, and a second count circuit configured to count a second signal that is based on the number of photons that have entered the second avalanche photodiode; and
an offset adding circuit configured to set an offset value for each of the first count circuit and the second count circuit,
wherein the first count circuit starts a first counter operation from a first offset value,
wherein the second count circuit starts a second counter operation from a second offset value,
wherein the first count circuit includes a first flip-flop,
wherein the second count circuit includes a second flip-flop, and
wherein, when an output signal of the first flip-flop switches from a first level to a second level, an output signal of the second flip-flop is maintained at either one of the first level or the second level.

2. The photoelectric conversion apparatus according to claim 1, further comprising a circuit configured to subtract the first offset value from a first count value output from the first count circuit.

3. The photoelectric conversion apparatus according to claim 1, further comprising a circuit configured to subtract the second offset value from a second count value output from the second count circuit.

4. The photoelectric conversion apparatus according to claim 1,
wherein a first pixel block including the first pixel and a second pixel block including the second pixel are included,
wherein the first offset value is set for a count circuit included in each pixel included in the first pixel block, and
wherein the second offset value is set for a count circuit included in each pixel included in the second pixel block.

5. The photoelectric conversion apparatus according to claim 4, wherein a largest count value of a count circuit included in each pixel included in the first pixel block, and a largest count value of a count circuit included in each pixel included in the second pixel block are different.

6. The photoelectric conversion apparatus according to claim 4, further comprising a pixel array including a plurality of pixels including the first pixel and the second pixel,
wherein the first pixel block is an outer peripheral part of the pixel array,
wherein the second pixel block is a center part of the pixel array, and
wherein the number of pixels included in the first pixel block is larger than the number of pixels included in the second pixel block.

7. The photoelectric conversion apparatus according to claim 1,
wherein the first flip-flop is a D flip-flop, and
wherein the offset adding circuit inputs a signal to an input terminal of the first flip-flop.

8. The photoelectric conversion apparatus according to claim 7,
wherein an output terminal of the first flip-flop is connected to a preset circuit, and
wherein a signal is input to an input terminal of the first flip-flop in accordance with a preset signal input to the preset circuit from the offset adding circuit.

9. The photoelectric conversion apparatus according to claim 1,
wherein a first substrate and a second substrate stacked on the first substrate are included,
wherein the first substrate includes the first pixel and the second pixel, and
wherein the second substrate includes the first count circuit, the second count circuit, and the offset adding circuit.

10. A photoelectric conversion system comprising:
the photoelectric conversion apparatus according to claim 1; and
a signal processing circuit configured to generate an image using a signal output by the photoelectric conversion apparatus.

11. A movable body comprising:
the photoelectric conversion apparatus according to claim 1; and
a control circuit configured to control a movement of the movable body using a signal output by the photoelectric conversion apparatus.

12. A photoelectric conversion apparatus comprising:
a first pixel including a first avalanche photodiode, and a first count circuit configured to count a first signal that is based on the number of photons that have entered the first avalanche photodiode;
a second pixel including a second avalanche photodiode, and a second count circuit configured to count a second signal that is based on the number of photons that have entered the second avalanche photodiode; and an offset adding circuit configured to set an offset value for each of the first count circuit and the second count circuit, wherein the first count circuit starts a first counter operation from a first offset value, wherein the second count circuit starts a second counter operation from a second offset value, wherein a first pixel block including the first pixel and a second pixel block including the second pixel are included, wherein the first offset value is set for a count circuit included in each pixel included in the first pixel block, wherein the second offset value is set for a count circuit included in each pixel included in the second pixel block, wherein the first pixel block is an outer peripheral part of a pixel array, wherein the pixel array includes the first pixel and the second pixel, wherein the second pixel block is a center part of the pixel array, and wherein the number of pixels included in the first pixel block is larger than the number of pixels included in the second pixel block.

13. The photoelectric conversion apparatus according to claim 12, further comprising a circuit configured to subtract the first offset value from a first count value output from the first count circuit.

14. The photoelectric conversion apparatus according to claim 12, further comprising a circuit configured to subtract the second offset value from a second count value output from the second count circuit.

15. The photoelectric conversion apparatus according to claim 12, wherein a first substrate and a second substrate stacked on the first substrate are included, wherein the first substrate includes the first pixel and the second pixel, and wherein the second substrate includes the first count circuit, the second count circuit, and the offset adding circuit.

16. A photoelectric conversion system comprising:

the photoelectric conversion apparatus according to claim 12; and a signal processing circuit configured to generate an image using a signal output by the photoelectric conversion apparatus.

17. A movable body comprising:

the photoelectric conversion apparatus according to claim 12; and a control circuit configured to control a movement of the movable body using a signal output by the photoelectric conversion apparatus.

\* \* \* \* \*